(12) United States Patent
Kanai

(10) Patent No.: US 6,829,165 B2
(45) Date of Patent: Dec. 7, 2004

(54) NON-VOLATILE SEMICONDUCTOR MEMORY DEVICE AND METHOD OF ACTUATING THE SAME

(75) Inventor: Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/448,112

(22) Filed: May 30, 2003

(65) Prior Publication Data
US 2004/0013027 A1 Jan. 22, 2004

(30) Foreign Application Priority Data
Jun. 6, 2002 (JP) ........................................ 2002-165461

(51) Int. Cl.[7] ................................................ G11C 16/04
(52) U.S. Cl. .......................... 365/185.11; 365/185.18; 365/185.21
(58) Field of Search ....................... 365/185.11, 185.18, 365/185.21

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,459,622 B1 * | 10/2002 | Ogura et al. | ............ 365/185.28 |
| 6,531,350 B2 * | 3/2003 | Satoh et al. | ................. 438/197 |
| 2002/0181267 A1 | 12/2002 | Owa | |
| 2002/0191441 A1 | 12/2002 | Owa | |
| 2002/0191453 A1 | 12/2002 | Owa | |
| 2003/0002343 A1 | 1/2003 | Kanai et al. | |
| 2003/0002344 A1 | 1/2003 | Kanai et al. | |
| 2003/0020123 A1 | 1/2003 | Kanai | |
| 2003/0021167 A1 | 1/2003 | Kamei | |
| 2003/0025149 A1 | 2/2003 | Kanai | |
| 2003/0025150 A1 | 2/2003 | Kanai et al. | |

(List continued on next page.)

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

U.S. Appl. No. 10/338,834, Natori, filed Jan. 9, 2003.
U.S. Appl. No. 10/446,827, Kanai, filed May, 29, 2003.
U.S. Appl. No. 10/373,166, Kamei et al., filed Feb. 26, 2003.

(List continued on next page.)

Primary Examiner—Hoai Ho
(74) Attorney, Agent, or Firm—Oliff & Berridge, PLC

(57) ABSTRACT

In a non-volatile semiconductor memory device of the present invention, in the case of reading information from a second non-volatile memory element of an (i)-th twin memory cell and from a first non-volatile memory element of an (i+1)-th twin memory cell in the row direction, where i is an integer of not less than 1, the process senses an (i−1)-th bit line connecting with a first non-volatile memory element of the (i)-th twin memory cell, so as to detect an electric current running between the (i−1)-th bit line and an (i)-th bit line connecting with the second non-volatile memory element of the (i)-th twin memory cell, via the second non-volatile memory element of the (i)-th twin memory cell. The process also senses an (i+1)-th bit line connecting with a second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell. This arrangement enhances the access speed of the non-volatile semiconductor memory device consisting of twin memory cells.

7 Claims, 19 Drawing Sheets

U.S. PATENT DOCUMENTS

| | | |
|---|---|---|
| 2003/0027411 A1 | 2/2003 | Kanai |
| 2003/0031064 A1 | 2/2003 | Natori |
| 2003/0034530 A1 | 2/2003 | Kamei |
| 2003/0048674 A1 | 3/2003 | Kanai |
| 2003/0072191 A1 | 4/2003 | Kamei |
| 2003/0072193 A1 | 4/2003 | Kamei et al. |
| 2003/0072194 A1 | 4/2003 | Kamei et al. |
| 2003/0076717 A1 | 4/2003 | Natori |
| 2003/0095443 A1 | 5/2003 | Natori |
| 2003/0103388 A1 | 6/2003 | Natori |

OTHER PUBLICATIONS

U.S. Appl. No. 10/338,833, Natori, filed Jan. 9, 2003.

U.S. Appl. No. 10/246,665, Natori, filed Sep. 19, 2002.

Yutaka Hayashi et al., "Twin MONOS Cell with Dual Control Gates," 2000, IEEE VLSI Technology Digest of Technical Papers, pp. 122–123.

Kuo–Tang Chang et al., "A New SONOS Memory Using Source–Side Injection for Programming," IEEE Electron Device Letters, vol. 19, No. 7, Jul. 1998, pp. 253–255.

Wei–Meng Chen et al., "A Novel Flash Memory Device with S Plit Gate Source Side Injection and ONO Charge Storage Stack (SPIN)," 1997, VLSI Technology Digest, pp. 63–64.

U.S. Appl. No. 10/361,573, Kamei et al., filed Feb. 11, 2003.

U.S. Appl. No. 10/385,661, Kamei, filed Mar. 13, 2003.

U.S. Appl. No. 10/385,506, Kamei et al., filed Mar. 12, 2003.

U.S. Appl. No. 10/377,699, Kamei et al., filed Mar. 4, 2003.

U.S. Appl. No. 10/229,064, Kamei, filed Aug. 28, 2002.

U.S. Appl. No. 10/356,644, Kamei et al., filed Feb. 3, 2003.

U.S. Appl. No. 10/323,921, Natori, filed Dec. 20, 2002.

U.S. Appl. No. 10/377,707, Kamei et al., filed Mar. 4, 2003.

* cited by examiner

Fig.2

| Mode | BS | Selected Twin MONOS Cell | | | | | Non-Selected Twin MONOS Cell | | |
|---|---|---|---|---|---|---|---|---|---|
| | | WL | Selected Memory Element | | Opposite Memory Element | | WL | SBL | SCG |
| | | | SBL | SCG | SBL | SCG | | | |
| Read | 4.5V Opposite Side Vdd Selected Side | Vdd | 0V | 1.5V±0.1V | sense | 3V | Vdd or 0V | sense or 0V | 3V or 1.5V±0.1V or 0V |
| Program | 8V | 約1V | 5V | 5.5V | Iprg=5uA (0 to 1V) | 2.5V | Approx. 1V or 0V | 5V or Vdd or(0 to 1V) | 5.5V or 2.5V or 0V |
| Erase | 8V | 0V | 4.5 to 5V | −1 to −3V | 4.5 to 5V | −1 to −3V | | | |

Fig.13

| Address | Functions |
|---|---|
| A<22:21> | Select one among 4 banks |
| A<20:18> | Select one among 8 memory arrays |
| A<17:15> | Select one among 8 main blocks |
| A<14:12> | Select one among 8 sub-blocks |
| A<11:10> | Select one among 4 small blocks |
| A<9:8> | Select four among 16 columns |
| A<7:2> | Select one among 64 word lines (rows) |
| A<1:0> | Select one among 4 columns |

Fig.16

| Selected Columns | | Selected Word Line (Row) | | | | | | | Selected Memory Elements | | | |
|---|---|---|---|---|---|---|---|---|---|---|---|---|
| A9 | A8 | Columns | A7 | A6 | A5 | A4 | A3 | A2 | Row | | | | |
| 0 | 0 | 1,5 | 0 | 0 | 0 | 0 | 0 | 0 | WL0 | 0A | 0B | 0C | 0D |
| 0 | 0 | 1,5 | 0 | 0 | 0 | 0 | 0 | 1 | WL1 | 1A | 1B | 1C | 1D |
| 0 | 0 | 1,5 | 1 | 1 | 1 | 1 | 1 | 0 | WL62 | 62A | 62B | 62C | 62D |
| 0 | 0 | 1,5 | 1 | 1 | 1 | 1 | 1 | 1 | WL63 | 63A | 63B | 63C | 63D |
| 0 | 1 | 2,6 | 0 | 0 | 0 | 0 | 0 | 0 | WL0 | 64A | 64B | 64C | 64D |
| 0 | 1 | 2,6 | 0 | 0 | 0 | 0 | 0 | 1 | WL1 | 65A | 65B | 65C | 65D |
| 0 | 1 | 2,6 | 1 | 1 | 1 | 1 | 1 | 0 | WL62 | 126A | 126B | 126C | 126D |
| 0 | 1 | 2,6 | 1 | 1 | 1 | 1 | 1 | 1 | WL63 | 127A | 127B | 127C | 127D |
| 1 | 0 | 3,7 | 0 | 0 | 0 | 0 | 0 | 0 | WL0 | 128A | 128B | 128C | 128D |
| 1 | 0 | 3,7 | 0 | 0 | 0 | 0 | 0 | 1 | WL1 | 129A | 129B | 129C | 129D |
| 1 | 0 | 3,7 | 1 | 1 | 1 | 1 | 1 | 0 | WL62 | 190A | 190B | 190C | 190D |
| 1 | 0 | 3,7 | 1 | 1 | 1 | 1 | 1 | 1 | WL63 | 191A | 191B | 191C | 191D |
| 1 | 1 | 4,8 | 0 | 0 | 0 | 0 | 0 | 0 | WL0 | 192A | 192B | 192C | 192D |
| 1 | 1 | 4,8 | 0 | 0 | 0 | 0 | 0 | 1 | WL1 | 193A | 193B | 193C | 193D |
| 1 | 1 | 4,8 | 1 | 1 | 1 | 1 | 1 | 0 | WL62 | 254A | 254B | 254C | 254D |
| 1 | 1 | 4,8 | 1 | 1 | 1 | 1 | 1 | 1 | WL63 | 255A | 255B | 255C | 255D |

NON-VOLATILE SEMICONDUCTOR MEMORY DEVICE AND METHOD OF ACTUATING THE SAME

BACKGROUND OF THE INVENTION

1. Field of the Invention

The present invention relates to a non-volatile semiconductor memory device consisting of twin memory cells, each including one word gate and two non-volatile memory elements controlled by two control gates, as well as to a method of actuating such a non-volatile semiconductor memory device.

2. Description of the Related Art

A known non-volatile semiconductor memory device that is capable of electric writing (programming) and erasing is MONOS (metal-oxide-nitride-oxide-semiconductor or -substrate) type, where a gate insulating layer between a channel and a gate is a laminate of a silicon oxide film, a silicon nitride film, and a silicon oxide film and the silicon nitride film traps electric charges.

The MONOS-type non-volatile semiconductor memory device is disclosed in a reference Y. Hayashi et al, 2000 Symposium on VLSI Technology Digest of Technical Papers p.122–123). This cited reference describes a twin MONOS flash memory cell having one word gate and two non-volatile memory elements (also be referred to as MONOS memory elements or cells) controlled by two control gates. Namely one flash memory cell has two trap sites of electric charges.

The MONOS-type non-volatile semiconductor memory device includes multiple twin MONOS flash memory cells of such structure, which are arrayed in rows and columns.

This non-volatile semiconductor memory device (flash memory) carries out data reading, writing (programming), and erasing operations. The data programming operation and the data reading operation are typically performed by the unit of 1 byte (8 bits) or by the unit of 1 word (16 bits). The procedure of the data programming operation or the data reading operation simultaneously selects 1 byte of or 1 word of non-volatile memory elements and simultaneously writes or reads data into or from these selected non-volatile memory elements (selected cells). The respective bit signals corresponding to these selected cells are input and output via I/O lines.

In the field of semiconductor memory devices, with the increased storage capacity and the enhanced access speed, the twin MONOS-type non-volatile semiconductor memory device consisting of twin MONOS flash memory cells is required to have the high access speed. In order to fulfill this requirement and enhance the read and write access speed, most semiconductor memory devices have a 'page mode reading' function to read data in a page mode for high-speed reading and a 'page buffer writing' function to write data into a page buffer for high-speed writing.

In the case of reading data from the semiconductor memory device by the 'page mode reading' function, in response to specification of a row address in the semiconductor memory device, all the contents of multiple memory elements or memory cells corresponding to the row address are registered in a temporary buffer in the semiconductor memory device. As the column address changes, the corresponding data are read from the temporary buffer and are output. The speed of reading data from the temporary buffer is higher than the speed of reading data from the memory cells. The 'page mode reading' function thus attains the high-speed read access.

In the case of writing data into the semiconductor memory device by the 'page buffer writing' function, multiple data of an identical row address but different column addresses are successively input and are registered in the page buffer. The multiple data registered in the page buffer are collectively written into multiple corresponding memory elements. The 'page buffer writing' function, which collectively writes multiple data into the corresponding memory elements, attains the high-speed write access.

In the prior art twin MONOS-type non-volatile semiconductor memory device, however, data are read and write by the unit of 1 byte or by the unit of 1 word, as mentioned previously. Namely the prior art twin MONOS-type non-volatile semiconductor memory device does not have the 'page mode reading' function or the 'page buffer writing function' and thereby can not attain the sufficiently high access speed.

SUMMARY OF THE INVENTION

In order to solve the drawbacks of the prior art technique discussed above, the object of the present invention is to provide a non-volatile semiconductor memory device of twin memory cells having access functions to allow for reading in a page mode and writing into a page buffer, thus enhancing the access speed.

In order to attain at least part of the above and the other related objects, a first application of the present invention is directed to a non-volatile semiconductor memory device, which includes: a memory cell array having multiple twin memory cells arrayed at least in a row direction, where each of the twin memory cells has one word gate, a first non-volatile memory element controlled by a first control gate, and a second non-volatile memory element controlled by a second control gate; a word line shared by the word gates of the multiple twin memory cells arrayed in the row direction; multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction; multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction; an access control circuit that regulates operations of the word line, the multiple bit lines, and the multiple control gate lines to control a reading operation of information; and a detection circuit that detects the information read via the multiple bit lines.

In the non-volatile semiconductor memory device of the first application, in the case of reading information from the second non-volatile memory element of an (i)-th twin memory cell and from the first non-volatile memory element of an (i+1)-th twin memory cell in the row direction, where i is an integer of not less than 1, the access control circuit sets a reading word line-selecting voltage to the word line connecting with the word gate of the (i)-th twin memory cell and with the word gate of the (i+1)-th twin memory cell. The access control circuit also sets a reading control gate voltage to the second control gate of the second non-volatile memory element of the (i)-th twin memory cell via an (i)-th control gate line connecting with the second control gate. The access control circuit further sets an override voltage to the first control gate of the first non-volatile memory element of the (i)-th twin memory cell via an (i−1)-th control gate line connecting with the first control gate, while setting an override voltage to the second control gate of the second non-volatile memory element of the (i+1)-th twin memory cell via an (i+1)-th control gate line connecting with the second control gate.

The detection circuit senses an (i−1)-th bit line connecting with the first non-volatile memory element of the (i)-th twin memory cell, so as to detect an electric current running between the (i−1)-th bit line and an (i)-th bit line connecting with the second non-volatile memory element of the (i)-th twin memory cell, via the second non-volatile memory element of the (i)-th twin memory cell. The detection circuit also senses an (i+1)-th bit line connecting with the second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell. The detection circuit thereby reads a piece of information stored in the second non-volatile memory element of the (i)-th twin memory cell together with a piece of information stored in the first non-volatile memory element of the (i+1)-th twin memory cell.

The structure of the non-volatile semiconductor memory device as the first application enables the information to be collectively read from the second non-volatile memory element included in the (i)-th twin memory cell and from the first non-volatile memory element included in the (i+1)-th twin memory cell in the row direction.

In one preferable embodiment of the first application, the non-volatile semiconductor memory device further includes a selection circuit that successively selects the two pieces of information read together by the detection circuit.

The successive selection and output of the collectively read information allows two pieces of information per page to be read in the page mode. The arrangement of the first application accordingly gives the non-volatile semiconductor memory device of twin memory cells that can read data in the page mode, thus enhancing the access speed.

A second application of the present invention is directed to a non-volatile semiconductor memory device, which includes: a memory cell array having multiple twin memory cells arrayed at least in a row direction, where each of the twin memory cells has one word gate, a first non-volatile memory element controlled by a first control gate, and a second non-volatile memory element controlled by a second control gate; a word line shared by the word gates of the multiple twin memory cells arrayed in the row direction; multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction; multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction; an access control circuit that regulates operations of the word line, the multiple bit lines, and the multiple control gate lines to control a reading operation of information; and a detection circuit that detects the information read via the multiple bit lines.

In the non-volatile semiconductor memory device of the second application, the memory cell array is divided into m memory blocks in the row direction, where m is an integer of not less than 1. Each of the memory blocks is divided into n column blocks in the row direction, where n is an integer of not less than 2.

In the non-volatile semiconductor memory device of the second application, in the case of reading information from the second non-volatile memory element of an (i)-th twin memory cell and from the first non-volatile memory element of an (i+1)-th twin memory cell in the row direction in each of the column blocks, where i is an integer of not less than 1, the access control circuit sets a reading word line-selecting voltage to the word line connecting with the word gate of the (i)-th twin memory cell and with the word gate of the (i+1)-th twin memory cell. The access control circuit also sets a reading control gate voltage to the second control gate of the second non-volatile memory element of the (i)-th twin memory cell via an (i)-th control gate line connecting with the second control gate. The access control circuit further sets an override voltage to the first control gate of the first non-volatile memory element of the (i)-th twin memory cell via an (i−1)-th control gate line connecting with the first control gate, while setting an override voltage to the second control gate of the second non-volatile memory element of the (i+1)-th twin memory cell via an (i+1)-th control gate line connecting with the second control gate.

The detection circuit senses an (i−1)-th bit line connecting with the first non-volatile memory element of the (i)-th twin memory cell, so as to detect an electric current running between the (i−1)-th bit line and an (i)-th bit line connecting with the second non-volatile memory element of the (i)-th twin memory cell, via the second non-volatile memory element of the (i)-th twin memory cell. The detection circuit also senses an (i+1)-th bit line connecting with the second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell. The detection circuit thereby reads a piece of information stored in the second non-volatile memory element of the (i)-th twin memory cell together with a piece of information stored in the first non-volatile memory element of the (i+1)-th twin memory cell.

Like the non-volatile semiconductor memory device of the first application, the structure of the non-volatile semiconductor memory device as the second application enables (2·n) pieces of information to be read collectively from the two non-volatile memory elements of n column blocks in each memory block.

In one preferable embodiment of the second application, the non-volatile semiconductor memory device further includes a selection circuit that is provided in each of the memory blocks and successively selects (2·n) pieces of information read together by the detection circuit.

The successive selection and output of the collectively read information allows (2·n) pieces of information per page to be read in the page mode. The arrangement of the second application accordingly gives the non-volatile semiconductor memory device of twin memory cells that can read data in the page mode, thus enhancing the access speed.

In the structure of the second application, the column block includes four twin memory cells arrayed in the row direction, and the memory block includes (4·n) twin memory cells arrayed in the row direction.

A third application of the present invention is directed to a non-volatile semiconductor memory device, which includes: a memory cell array having multiple twin memory cells arrayed at least in a row direction, where each of the twin memory cells has one word gate, a first non-volatile memory element controlled by a first control gate, and a second non-volatile memory element controlled by a second control gate; a word line shared by the word gates of the multiple twin memory cells arrayed in the row direction; multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction; multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction; an access control circuit that regulates operations of the word line, the multiple bit lines, and the multiple control gate lines to control a reading operation of information; a buffer circuit that stores in advance multiple pieces of information; and a bit line actuation circuit that is driven to write the information stored in the buffer circuit via the multiple bit lines.

In the non-volatile semiconductor memory device of the third application, the memory cell array is divided into m memory blocks in the row direction, where m is an integer of not less than 1. Each of the memory blocks is divided into n column blocks in the row direction, where n is an integer of not less than 2, In the non-volatile semiconductor memory device of the third application, in the case of writing the information into the second non-volatile memory element of an (i)-th twin memory cell in the row direction in each of the column blocks, where i is an integer of not less than 1, the access control circuit sets a programming word line-selecting voltage to the word line connecting with the word gate of the (i)-th twin memory cell. The access control circuit also sets a programming control gate voltage to the second control gate of the second non-volatile memory element of the (i)-th twin memory cell via an (i)-th control gate line connecting with the second control gate. The access control circuit further sets a programming bit line voltage, which is supplied from the bit line actuation circuit, to an (i)-th bit line connecting with the second non-volatile memory element of the (i)-th twin memory cell.

The non-volatile semiconductor memory device of the third application enables information to be written into one non-volatile memory element in each of n column blocks in each memory block. Namely the n pieces of information stored in advance in the buffer circuit can be written collectively. The arrangement of the third application accordingly gives the non-volatile semiconductor memory device of twin memory cells that can write data into the page buffer, thus enhancing the access speed.

A fourth application of the present invention is directed to a method of actuating a non-volatile semiconductor memory device. Here the non-volatile semiconductor memory device includes: a memory cell array having multiple twin memory cells arrayed at least in a row direction, where each of the twin memory cells has one word gate, a first non-volatile memory element controlled by a first control gate, and a second non-volatile memory element controlled by a second control gate; a word line shared by the word gates of the multiple twin memory cells arrayed in the row direction; multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction; and multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction.

In the case of reading information from the second non-volatile memory element of an (i)-th twin memory cell and from the first non-volatile memory element of an (i+1)-th twin memory cell in the row direction, where i is an integer of not less than 1, the method of the fourth application includes the steps of: setting a reading word line-selecting voltage to the word line connecting with the word gate of the (i)-th twin memory cell and with the word gate of the (i+1)-th twin memory cell; setting a reading control gate voltage to the second control gate of the second non-volatile memory element of the (i)-th twin memory cell via an (i)-th control gate line connecting with the second control gate; and setting an override voltage to the first control gate of the first non-volatile memory element of the (i)-th twin memory cell via an (i−1)-th control gate line connecting with the first control gate, while setting an override voltage to the second control gate of the second non-volatile memory element of the (i+1)-th twin memory cell via an (i+1)-th control gate line connecting with the second control gate. The method also includes the step of sensing an (i−1)-th bit line connecting with the first non-volatile memory element of the (i)-th twin memory cell, so as to detect,an electric current running between the (i−1)-th bit line and an (i)-th bit line connecting with the second non-volatile memory element of the (i)-th twin memory cell, via the second non-volatile memory element of the (i)-th twin memory cell, sensing an (i+1)-th bit line connecting with the second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell, thereby reading a piece of information stored in the second non-volatile memory element of the (i)-th twin memory cell together with a piece of information stored in the first non-volatile memory element of the (i+1)-th twin memory cell.

Like the non-volatile semiconductor memory device of the first application, the method of actuating the non-volatile semiconductor memory device as the fourth application enables the information to be collectively read from the second non-volatile memory element included in the (i)-th twin memory cell and from the first non-volatile memory element included in the (i+1)-th twin memory cell in the row direction. This arrangement enhances the access speed of the non-volatile semiconductor device consisting of twin memory cells.

A fifth application of the present invention is directed to a method of actuating a non-volatile semiconductor memory device. Here the non-volatile semiconductor memory device includes: a memory cell array having multiple twin memory cells arrayed at least in a row direction, where each of the twin memory cells has one word gate, a first non-volatile memory element controlled by a first control gate, and a second non-volatile memory element controlled by a second control gate; a word line shared by the word gates of the multiple twin memory cells arrayed in the row direction; multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction; and multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction. In this non-volatile semiconductor memory device, the memory cell array is divided into m memory blocks in the row direction, where m is an integer of not less than 1. Each of the memory blocks is divided into n column blocks in the row direction, where n is an integer of not less than 2, In the case of reading information from the second non-volatile memory element of an (i)-th twin memory cell and from the first non-volatile memory element of an (i+1)-th twin memory cell in the row direction in each of the column blocks, where 1 is an integer of not less than 1, the method of the fifth application includes the steps of: setting a reading word line-selecting voltage to the word line connecting with the word gate of the (i)-th twin memory cell and with the word gate of the (i+1)-th twin memory cell; setting a reading control gate voltage to the second control gate of the second non-volatile memory element of the (i)-th twin memory cell via an (i)-th control gate line connecting with the second control gate; and setting an override voltage to the first control gate of the first non-volatile memory element of the (i)-th twin memory cell via an (i−1)-th control gate line connecting with the first control gate, while setting an override voltage to the second control gate of the second non-volatile memory element of the (i+1)-th twin memory cell via an (i+1)-th control gate line connecting with the second control gate. The method also includes the step of: sensing an (i−1)-th bit line connecting with the first non-volatile memory element of the (i)-th twin memory cell, so as to detect an electric current running between the (i−1)-th bit line and an (i)-th bit line connecting with the second non-volatile memory element of the (i)-th twin memory cell, via the second non-volatile memory element of the (i)-th twin memory cell, sensing an (i+1)-th bit line connecting with the second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell, thereby reading a piece of information stored in the second non-volatile memory element of the (i)-th twin memory cell together with a piece of information stored in the first non-volatile memory element of the (i+1)-th twin memory cell.

Like the non-volatile semiconductor memory device of the second application, the method of actuating the non-volatile semiconductor memory device as the fifth application enables (2·n) pieces of information to be read collectively from the two non-volatile memory elements of n column blocks in each memory block. This arrangement enhances the access speed of the non-volatile semiconductor memory device consisting of twin memory cells.

A sixth application of the present invention is directed to a method of actuating a non-volatile semiconductor memory device. Here the non-volatile semiconductor memory device includes: a memory cell array having multiple twin memory cells arrayed at least in a row direction, where each of the twin memory cells has one word gate, a first non-volatile memory element controlled by a first control gate, and a second non-volatile memory element controlled by a second control gate; a word line shared by the word gates of the multiple twin memory cells arrayed in the row direction; multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction; and multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction. In this non-volatile semiconductor memory device, the memory cell array is divided into m memory blocks in the row direction, where m is an integer of not less than 1. Each of the memory blocks is divided into n column blocks in the row direction, where n is an integer of not less than 2.

In the case of writing the information into the second non-volatile memory element of an (i)-th twin memory cell in the row direction in each of the column blocks, where i is an integer of not less than 1, the method of the sixth application includes the steps of: setting a programming word line-selecting voltage to the word line connecting with the word gate of the (i)-th twin memory cell; setting a programming control gate voltage to the second control gate of the second non-volatile memory element of the (i)-th twin memory cell via an (i)-th control gate line connecting with the second control gate; and setting a programming bit line voltage, which is supplied from the bit line actuation circuit, to an (i)-th bit line connecting with the second non-volatile memory element of the (i)-th twin memory cell.

Like the non-volatile semiconductor memory device of the third application, the method of actuating the non-volatile semiconductor memory device as the sixth application enables the non-volatile semiconductor memory device of twin memory cells to write data into the page buffer, thus enhancing the access speed of the non-volatile semiconductor memory device.

The above and other objects, features, aspects, and advantages of the present invention will become more apparent from the following detailed description of the preferred embodiment with the accompanying drawings.

BRIEF DESCRIPTION OF THE DRAWINGS

FIG. 2 shows setting voltages in operations of reading data from, writing data into, and erasing data from each MONOS memory element;

FIG. 13 shows meanings of a 23-bit address signal A<22:0> input into the non-volatile semiconductor memory device;

FIG. 16 shows memory elements corresponding to a 2-bit first column-selecting address signal A<9:8> and a 6-bit word line-selecting address signal A<7:2>;

DESCRIPTION OF THE PREFERRED EMBODIMENTS

One mode of carrying out the present invention is discussed below as a preferred embodiment in the following sequence:
A. Structure and Working Principles of Twin Memory Cell
   A1. Structure of Twin Memory Cell
   A2. Reading Principle of Twin Memory Cell
   A3. Writing Principle of Twin Memory Cell
   A4. Erasing Principle of Twin Memory Cell
B. General Construction of Non-Volatile Semiconductor Memory Device
   B1. General Structure
   B2. Functional Structure
   B3. Structure of Small Arrays
C. Address Settings of Memory Elements
D. Reading Operations
E. Writing Operations
F. Modifications A. Structure and Working Principles of Twin Memory Cell The following describes the structure and the operations of a twin MONOS flash memory cell (hereafter may be referred to simply as 'twin memory cell') used as memory elements of a twin MONOS-type non-volatile semiconductor memory device.

A1. Structure of Twin Memory Cell

Figure 1:
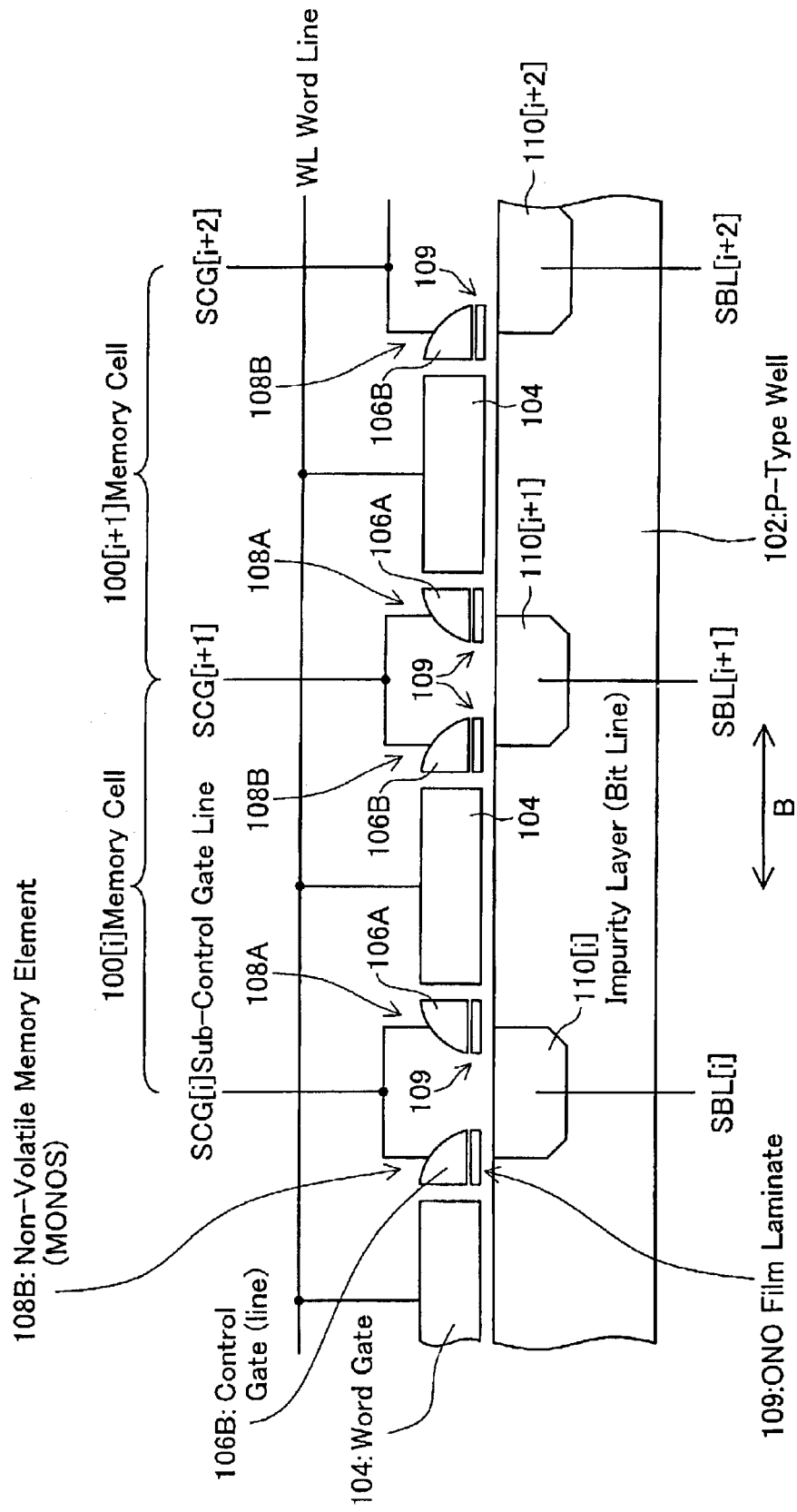
FIG. 1 is a sectional view schematically illustrating the structure of a twin memory cell.

FIG. 1 is a sectional view schematically illustrating the structure of the twin memory cell. As shown in FIG. 1, a twin memory cell-type non-volatile semiconductor memory device has multiple twin memory cells 100 ( . . . , 100[i], 100[i+1], . . . : where i is a positive number of not less than 1), which are arrayed in a row direction or in a second direction B (hereafter may also be referred to as 'word line direction') on a P-type well 102. Multiple twin memory cells 100 are also arrayed in a column direction or in a first direction A perpendicular to the sheet surface of FIG. 1 (hereafter may also be referred to as 'bit line direction'). Namely the twin memory cells 100 are arranged in a matrix.

One twin memory cell 100 has a word gate 104 formed on the P-type well 102 via a gate oxide film, a first memory element (MONOS memory element) 108A with a first control gate 106A, and a second memory element (MONOS memory element) 108B with a second control gate 106B.

Each of the first and the second memory elements 108A and 108B has an ONO film 109 of an oxide film (O), a nitride film (N), and an oxide film (O) depositing on the P-type well 102. The ONO film 109 is capable of trapping electric charges. The first control gate 106A and the second control gate 106B are formed on the respective ONO films 109 of the first memory element 108A and the second memory element 108B. The working statuses of the first and the second MONOS memory elements 108A and 108B are controlled respectively by the first and the second control gates 106A and 106B, which are composed of polysilicon corresponding to the metal M of the MONOS structure. The first and the second control gates 106A and 106B may otherwise be composed of a conductive material, such as a silicide.

The word gate 104 made of, for example, a polysilicon-containing material, is formed in an electrically insulated manner between the first and the second memory elements 108A and 108B. The voltage applied onto the word gate 104 specifies selection of either the first memory element 108A or the second memory element 108B of each twin memory cell 100.

As described above, each twin memory cell 100 has the first and the second memory elements 108A and 108B with the split gates (the first and the second control gates 106A and 106B) and one word gate 104 shared by the first and the second memory elements 108A and 108B.

Each of the first and the second memory elements 108A and 108B independently functions as a trap site of electric charge. The word gates 104 controlling the trap of electric charge are arranged at preset intervals in the second direction B (in the row direction) and are connected commonly with one word line WL composed of, for example, polycide, as shown in FIG. 1. Supply of a predetermined signal to the word line WL allows for selection of at least one of the first and the second memory elements 108A and 108B in each of the twin memory cells 100 arrayed on an identical row.

The respective control gates 106A and 106B are extended in the column direction (that is, in the first direction A perpendicular to the sheet surface of FIG. 1) to be shared by multiple twin memory cells 100 arrayed on an identical column and function as control gate lines. The symbols 106A and 106B thus also represent the control gate lines. The mutually adjacent control gates 106A and 106B included in each pair of the twin memory cells 100 adjoining to each other in the row direction are commonly connected to a sub-control gate line SCG ( . . . , SCG[i], SCG[i+1], . . . ). The sub-control gate lines SCG are made of an metal layer, which is located above the word gates 104, the control gates 106A and 106B, and the word lines WL. The arrangement of independently applying a voltage onto each sub-control gate line SCG allows for independent control of the first memory element 108A and the second memory element 108B of each memory cell 100, as discussed later.

An impurity layer 110 ( . . . , 110[i], 110[i+1], . . . ) is formed in the P-type well 102 between the mutually adjacent memory elements 108A and 108B included in each pair of the twin memory cells 100 adjoining to each other in the row direction. These impurity layers 110 are, for example, n-type impurity layers formed in the P-type well 102 and are extended in the column direction to be shared by multiple twin memory cells 100 arrayed on an identical column and function as sub-bit lines SBL ( . . . , SBL[i], SBL[i+1], . . . ). The symbols 110[i], 110[i+1], 110[i+2], and the like thus also represent the sub-bit lines SBL[i], SBL[i+1], SBL[i+2], and the like.

Application of a voltage to each sub-bit line SBL and detection of an electric current enable the electric charge (information) to be read from, programmed or written into, and erased from one memory element of each memory cell 100 specified by the word line WL and the sub-control gate line SCG.

Figure 3:
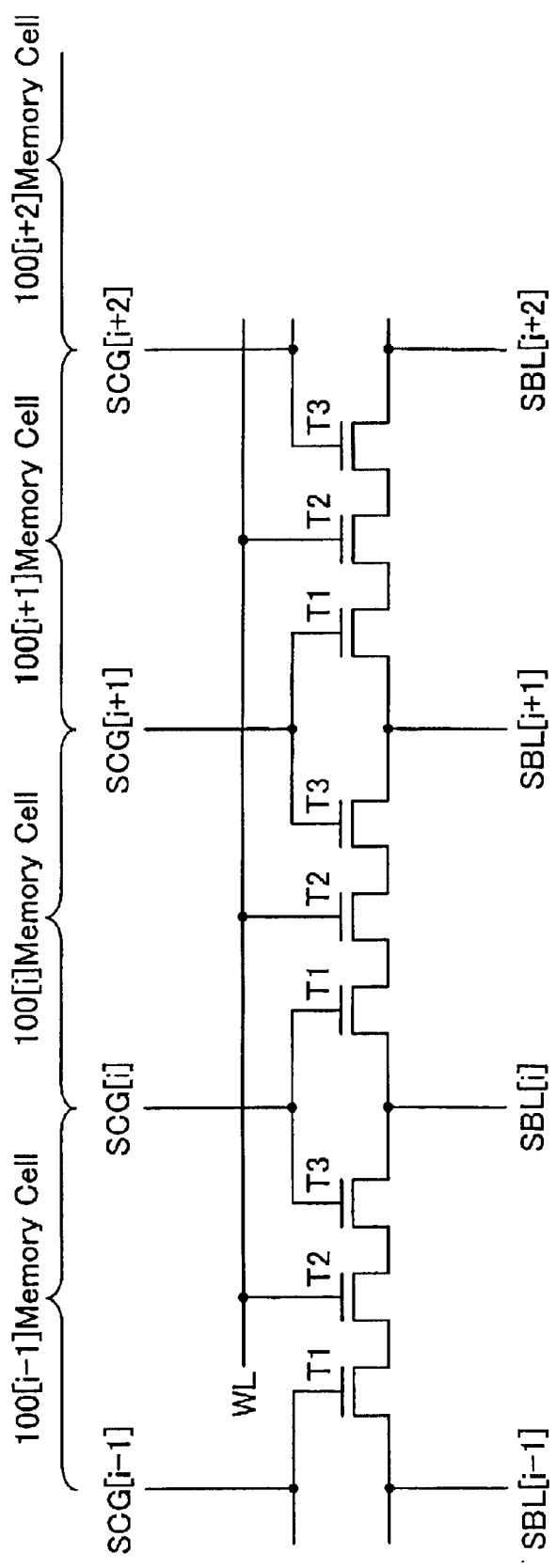
FIG. 3 shows an equivalent structure to the twin memory cell.

The following describes the principles of operations of reading data from, writing data into, and erasing data from each MONOS memory element (memory cell). FIG. 2 shows setting voltages in the respective operations of reading data from, writing data into, and erasing data from each MONOS memory element. FIG. 3 shows an equivalent structure to the twin memory cells 100. As shown in FIG. 3, each twin memory cell 100 is expressible as a combination of a transistor T2 driven by the word gate 104 and transistors T1 and T3 driven respectively by the first control gate 106A and the second control gate 106B, where these transistors T2, T1, and T3 are connected in series.

A2. Reading Principle of Twin Memory Cell

Figure 4:
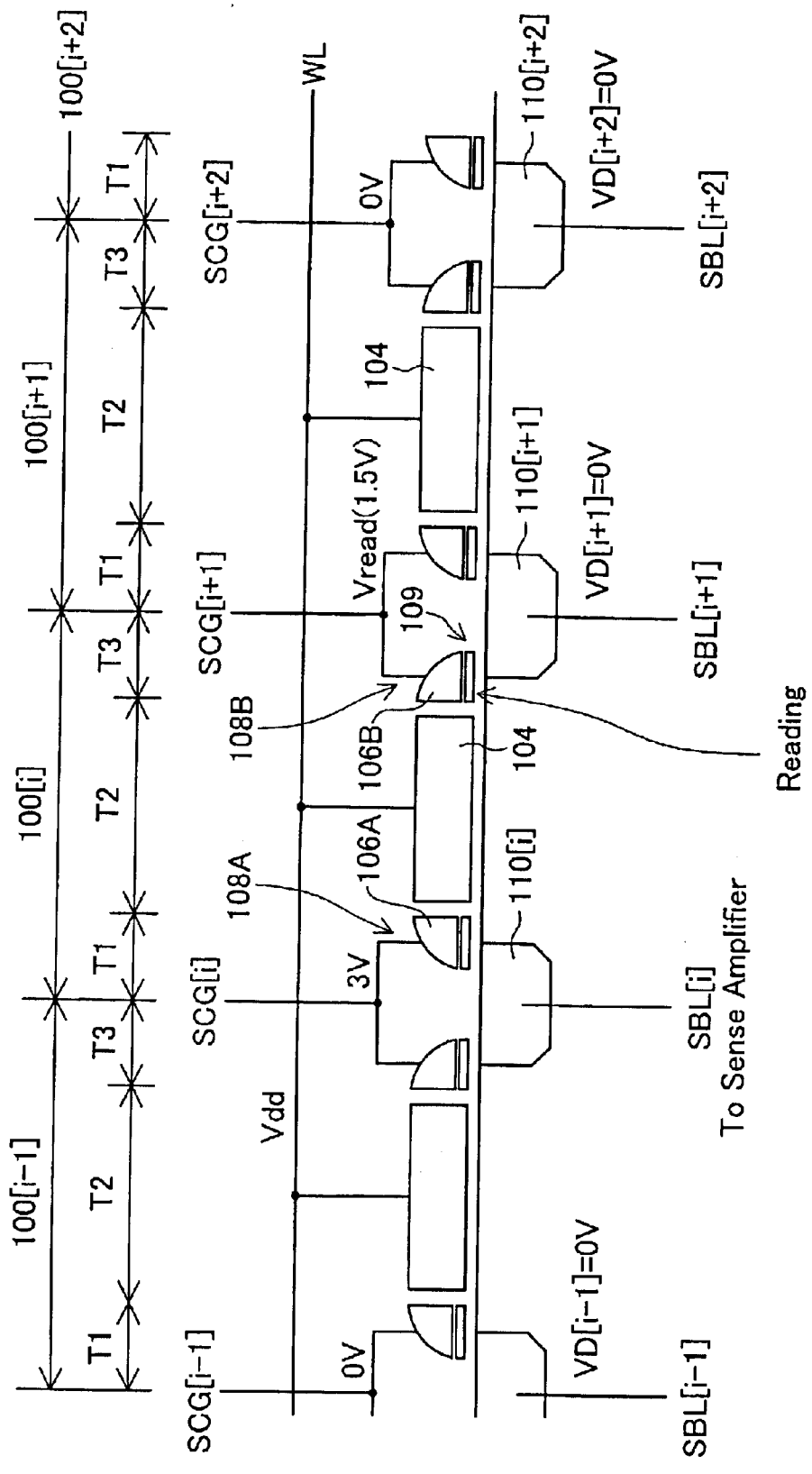
FIG. 4 schematically shows an operation of reading data from each twin memory cell.

FIG. 4 schematically shows an operation of reading data from each twin memory cell 100. FIG. 4 shows potential settings at various positions in the process of reading data from a selected memory element 108B in a reverse mode, where a twin memory cell 100[i] connecting with one word line WL is a selected cell and the side of the memory element 108B located on the right of the word gate 104 in the selected cell is a selected side. FIG. 4 also shows potential settings at various positions of twin memory cells 100[i-1] through 100[i+2], which include the selected cell and non-selected cells adjacent to the selected cell. In the description hereafter, the other side opposite to the selected side in the selected cell is referred to as the opposite side, and the memory element 108A on the opposite side is referred to as the opposite memory element.

A power supply voltage Vdd (for example, 1.8 V) is applied as a reading word line-selecting voltage onto the word line WL connecting with the word gate 104 of the twin memory cell 100[i] as the selected cell. Such application of the power supply voltage Vdd switches ON all the transistors T2 in the respective twin memory cells 100 connecting with this word line WL. A voltage of 0 V is applied, on the other hand, onto all the other non-selected word lines WL.

An override voltage (for example, 3V) is applied onto the control gate 106A on the opposite side of the twin memory cell 100[i] via the sub-control gate line SCG[i]. A reading voltage Vread (for example, 1.5 V) is applied as a control gate voltage VCG, which is to be supplied to the control gate 106B on the selected side of the twin memory cell 100[i].

The override voltage represents a voltage required to switch ON a transistor (T1 in this example) corresponding to the opposite memory element (108A in this example) in the selected cell, regardless of the presence or the absence of a program (that is, the presence or the absence of trapped electric charge) in the opposite memory element.

Application of the override voltage onto the control gate 106A on the opposite side switches ON the transistor T1 corresponding to the opposite memory element 108A. In this case, the operation of the transistor T3 corresponding to the selected memory element 108B depends upon accumulation or non-accumulation of electric charge in the selected memory element 108B.

Figure 5:
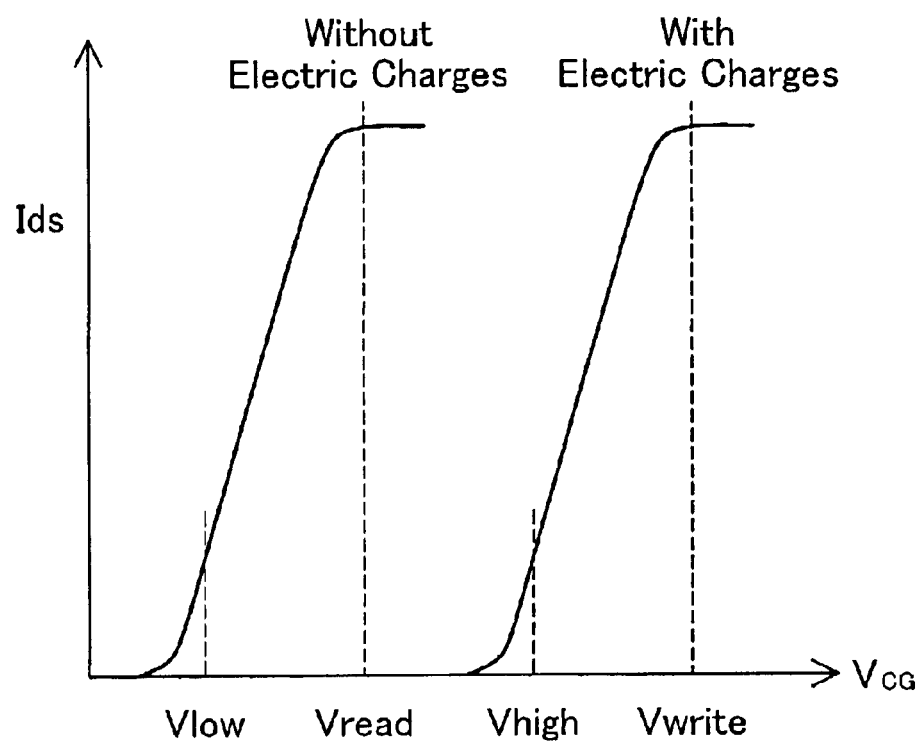
FIG. 5 is a graph showing curves of the electric current Ids running between a source and a drain of a transistor corresponding to a selected memory element as ordinate, plotted against the control gate voltage VCG applied onto a control gate on a selected side as abscissa.

FIG. 5 is a graph showing curves of the electric current Ids running between a source and a drain of the transistor corresponding to the selected memory element as ordinate, plotted against the control gate voltage VCG applied onto the control gate on the selected side as abscissa.

As shown in FIG. 5, in the case of no accumulation of electric charge in the selected memory element 108B, the electric current Ids starts flowing when the control gate voltage VCG exceeds a lower threshold voltage Vlow. In the case of accumulation of electric charge in the selected memory element 108B, on the contrary, the electric current Ids does not start flowing until the control gate voltage VCG exceeds a higher threshold voltage Vhigh.

A substantially intermediate voltage between the two threshold voltages Vlow and Vhigh is set to the voltage Vread applied onto the control gate 106B on the selected side in the data reading process. The electric current Ids accordingly flows in the case of no accumulation of electric charge in the selected memory element 108B, while not flowing in the case of accumulation of electric charge in the selected memory element 108B.

In the data reading process, the sub-bit line SBL[i] (the impurity layer 110[i]) linked with the opposite memory element 108A is connected with a sense amplifier (not shown), while 0 V is set respectively to potentials VD[i-1], VD[i+1], and VD[i+2] of the other sub-bit lines SBL[i-1], SBL[i+1], SBL[i+2]. This arrangement causes the electric current Ids to flow under the condition of no accumulation of electric charge in the selected memory element 108B. An electric current of or over, for example, 25 μA flows through the sub-bit line SBL[i] connected with the opposite memory element via the transistors T1 and T2 in the ON state. This arrangement causes no electric current Ids to flow, on the contrary, under the condition of accumulation of electric charge in the selected memory element 108B. Even in the ON state of the transistors T1 and T2, the electric current flowing through the sub-bit line BL[i] connected with the opposite memory element is, for example, less than 10 nA.

The sense amplifier measures the electric current flowing through the sub-bit line SBL[i] connected with the opposite memory element 108A of the twin memory cell 100[i]. Such measurement allows data to be read from the selected memory element 108B of the twin memory cell 100[i].

A bit line selecting transistor (not shown) is connected with each of the sub-bit lines SBL[i−1] through SBL[i+2]. A gate voltage BS of the bit line selecting transistor on the opposite side is set equal to 4.5 V as shown in FIG. 2. The gate voltage BS of the bit line selecting transistor on the selected side is, on the other hand, set equal to the power supply voltage Vdd.

The respective voltages shown in FIG. 2 are set with regard to the non-selected twin memory cells.

A3. Writing Principle of Twin Memory Cell

Figure 6:
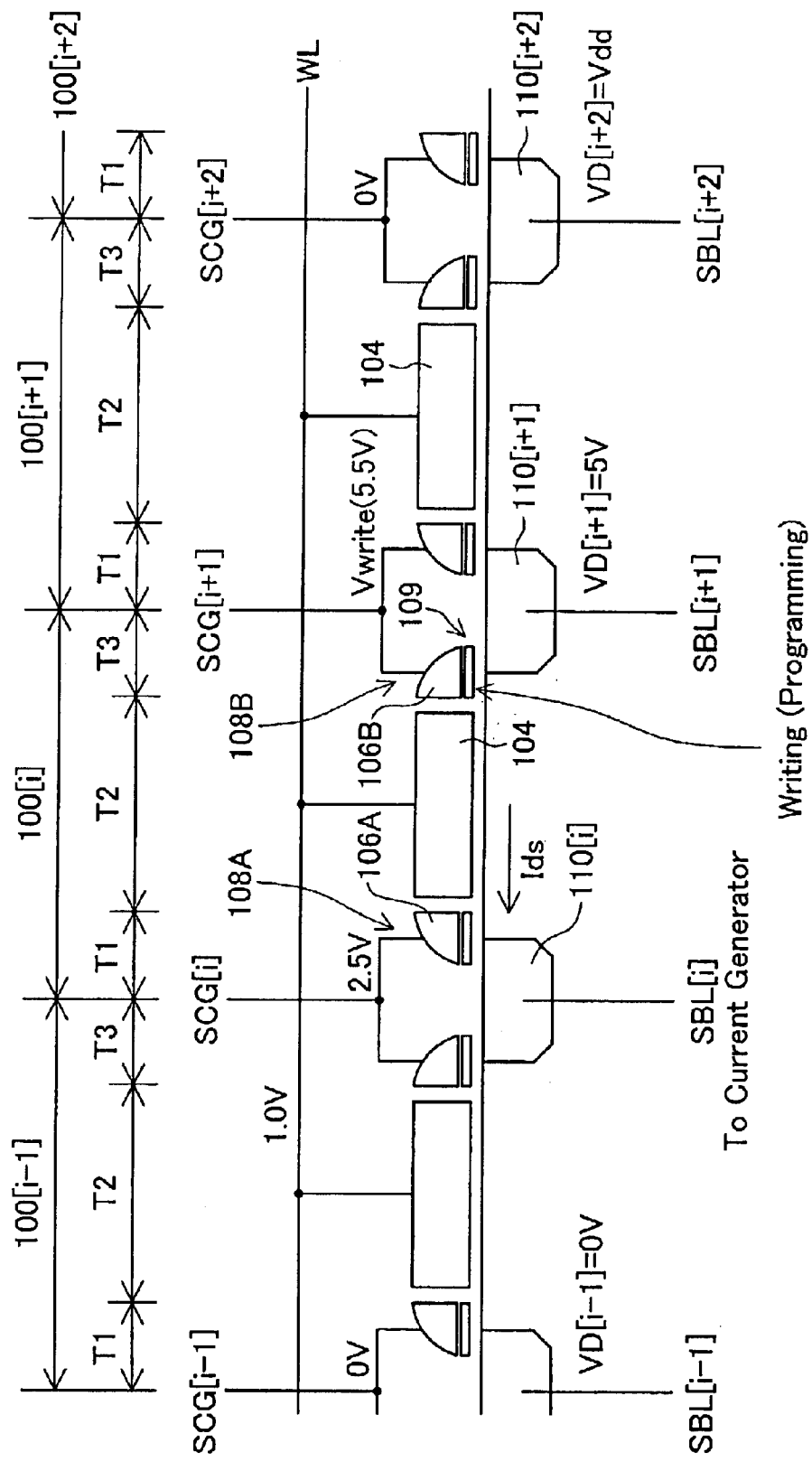
FIG. 6 schematically shows an operation of writing data into each twin memory cell.

FIG. 6 schematically shows an operation of writing data into each twin memory cell 100. FIG. 6 shows potential settings at various positions in the process of programming data into the selected MONOS memory element 108B or a selected memory element, where the twin memory cell 100[i] connecting with one word line WL is a selected cell and the side of the MONOS memory element 108B located on the right of the word gate 104 in the selected cell is a selected side. A series of data erasing operation, which will be discussed later, is carried out prior to this series of data programming operation.

In the state of FIG. 6, as in the case of FIG. 4, an override voltage (for example, 2.5 V) is set to the potential of the sub-control gate line SCG[i], while 0V is set to the potentials of the sub-control gate lines SCG[i−1] and SCG[i+2].

A programming word line-selecting voltage of approximately 1.0 V, which is lower than the power supply voltage Vdd, is set to the potential of the word gate 104 in the selected cell or the twin memory cell 100[i]. A programming control gate voltage or a writing voltage Vwrite (for example, 5.5 V) is applied onto the control gate 106B on the selected side of the twin memory cell 100[i] via the sub-control gate line SCG[i+1].

A programming bit line voltage of, for example, 5 V is set to the potential VD[i+1] of the sub-bit line SBL[i+1], whereas the power supply voltage Vdd is set to the potential VD[i+2] of the sub-bit line SBL[i+2]. The sub-bit lines SBL[i−1] and SBL[i] are connected to a current generator (not shown). The transistor T1 corresponding to the MONOS memory element 108A connecting with the sub-bit line SBL[i−1] is set in the OFF state, since the potential of the corresponding sub-control gate line SCG[i−1] is set equal to 0 V. No electric current accordingly flows through this MONOS memory element 108A, and the potential VD[i−1] of the sub-bit line SBL[i−1] is set equal to 0 V via the current generator.

Such settings switch ON both the transistors T1 and T2 in the selected cell or the twin memory cell 100[i]. The electric current Ids accordingly flows towards the sub-bit line SBL[i], and channel hot electron (CHE) is trapped by the ONO film 109 of the selected memory element or the MONOS memory element 108B. The data programming operation is carried out in this manner to write data '0' into the selected memory element 108B.

The voltage of 5.5 V is also applied onto the control gate 106A of the MONOS memory element 108A on the left side of the non-selected twin memory cell 100[i+1]. The voltage of 0 V is, however, applied to the sub-control gate SCG[i+2] on the right side of the twin memory cell 100[i+1]. No electric current accordingly flows between a source and a drain (between bit lines) of the twin memory cell 100[i+1]. The voltage of 5 V is, on the other hand, applied as the potential VD[i+1] of the sub-bit line SBL[i+1]. Impression of a high electric field between the source and the drain (between the bit lines) of the twin memory cell 100[i+1] thus causes a flow of punch-through current, which results in 'write disturbance'.

In order to reduce the potential difference between the source and the drain and prevent the 'write disturbance', the power supply voltage Vdd, instead of 0 V, is set to the potential VD[i+2] of the sub-bit line SBL[i+2]. Setting a voltage exceeding 0 V or preferably a voltage of equivalent to or greater than the word line-selecting voltage in the data programming process to the potential VD[i+2] of the sub-bit line SBL[i+2] reduces the switch-ON possibility of the transistor T2 in the twin memory cell 100[i+1] and thereby prevents the 'write disturbance'.

As described above, it is required to supply the voltage of 5 V to the sub-bit line SBL[i+1]. The gate voltage BS of the bit line selecting transistor for selection of the sub-bit line SBL[i+1] is accordingly set equal to 8.0 V as shown in FIG. 2. Setting the voltage equivalent to or greater than the power supply voltage Vdd to the potential VD[i+2] of the sub-bit line SBL[i+2] is required, because of the reason discussed above. The gate voltage BS of a bit line selecting transistor (not shown) for selection of the sub-bit line SBL[i+2] is also set equal to 8 V.

The respective voltages shown in FIG. 2 are set with regard to the non-selected twin memory cells.

A4. Erasing Principle of Twin Memory Cell

Figure 7:
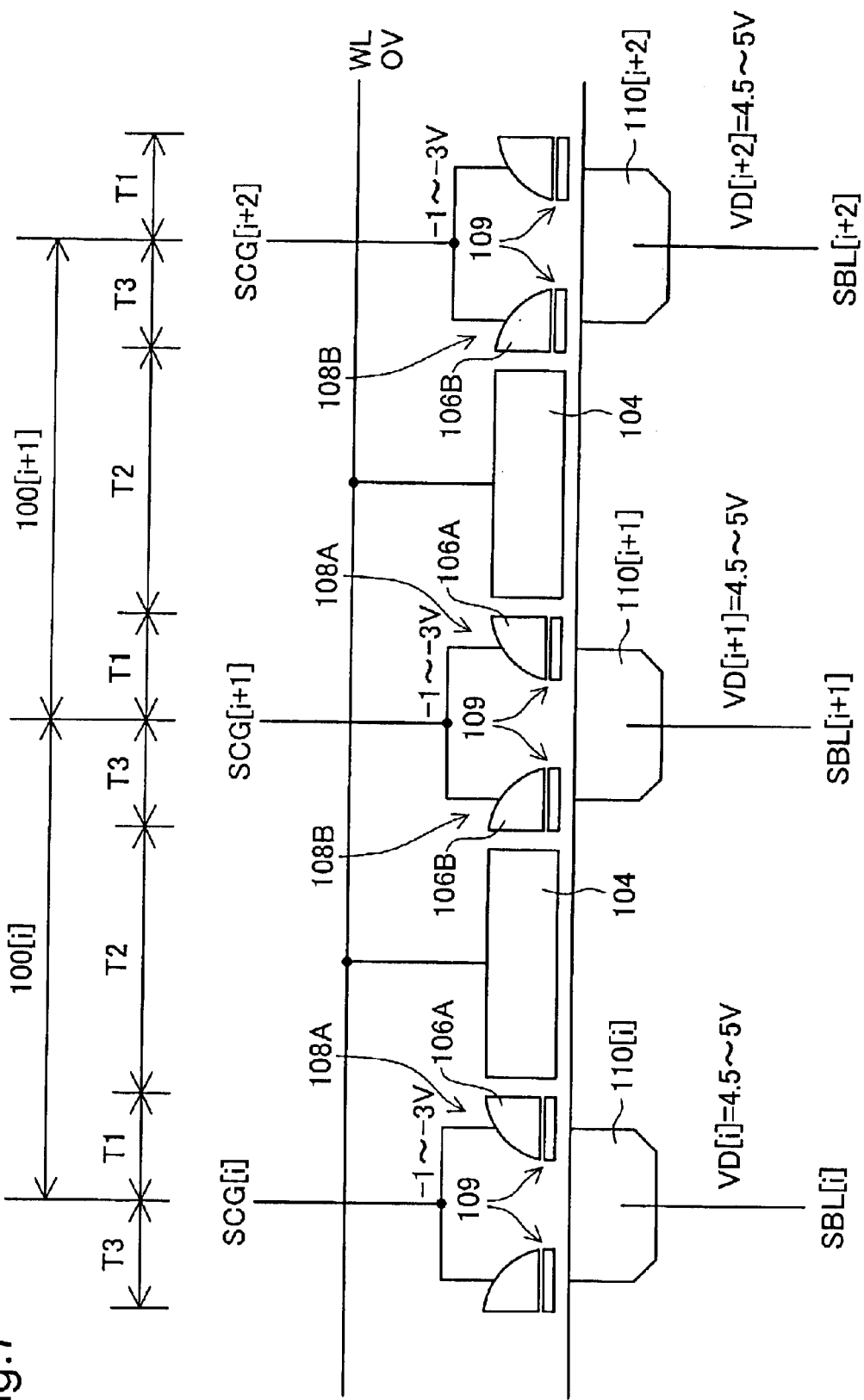
FIG. 7 schematically shows an operation of erasing data from each twin memory cell.

FIG. 7 schematically shows an operation of erasing data from each twin memory cell. FIG. 7 shows potential settings at various positions in the data erasing process.

As shown in FIG. 7, in the data erasing process, the potentials of the respective word gates 104 are set equal to 0 V by means of the word line WL. An erasing control gate line voltage of, for example, −1 to −3 V is set to the potentials of the respective control gates 106A and 106B by means of the sub-control gate lines SCG[i], SCG[i+1], and SCG[i+2]. An erasing bit line voltage of, for example, 4.5 to 5 V is set to the potentials of the sub-bit lines SBL[i], SBL[i+1], and SBL[i+2].

The combination of the erasing control gate line voltage applied onto the control gates with the erasing bit line voltage applied onto the bit lines forms an electric field and has tunneling effects. The tunneling effects cause the electrons trapped by the ONO films 109 of the respective memory elements 108A and 108B to be shifted and erased from the ONO films 109. Data in the respective memory elements of the multiple twin memory cells thus become to '1' simultaneously to effectuate data erasing.

Another applicable procedure of the erasing operation forms hot holes by means of band-band tunneling effects on the surface of the impurity layers as bits, so as to erase the electrons accumulated in the ONO films 109.

As described above, setting the potentials of the word gates, the control gates, and the bit lines equal to the respective voltages shown in FIG. 2 enables data to be read from, written into, or erased from each MONOS memory element.

In the described above, the unit structure of each twin memory cell 100 includes the first memory element 108A with the control gate 106A and the second memory element 108B with the second control gate 106B, which are arranged on both sides of one word gate 104. The unit structure of each twin memory cell 100 may alternatively include the left memory element 108B and the right memory element 108A that adjoin to each other and share one sub-bit line SBL (one impurity layer 110). In the discussion given below, the combination of the left memory element 108B and the right memory element 108A that adjoin to each other and share one sub-bit line SBL (one impurity layer 110) may thus be regarded as the unit structure of each twin memory cell 100.

B. Structure of Non-Volatile Semiconductor Memory Device

The following describes the structure of a non-volatile semiconductor memory device including the multiple twin memory cells 100 described above.

B1. General Structure

Figure 8:
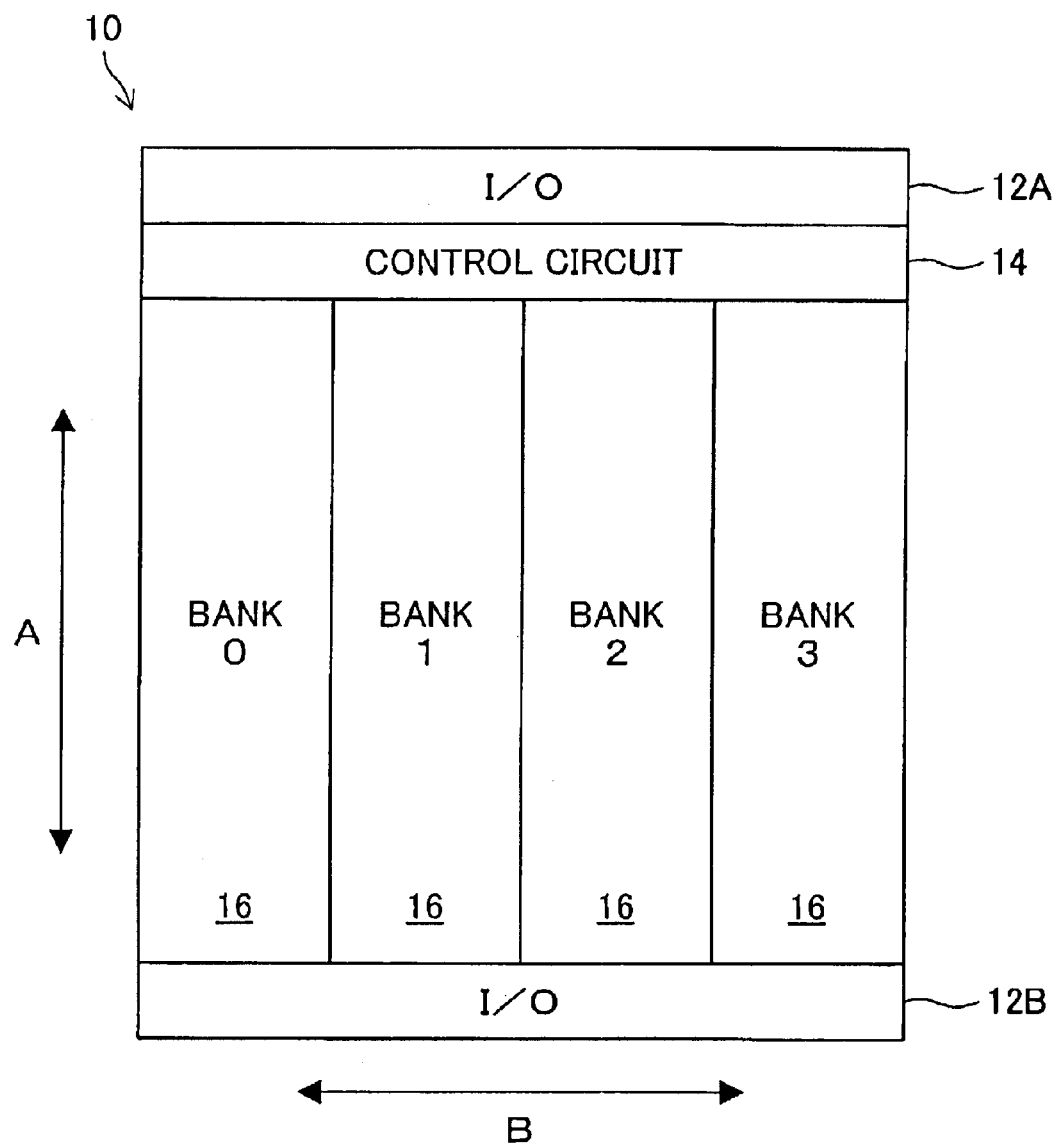
FIG. 8 is a plan view schematically showing the layout of a non-volatile semiconductor memory device in one embodiment.

FIG. 8 is a plan view schematically showing the layout of a non-volatile semiconductor memory device 10 in one embodiment. The non-volatile semiconductor memory device 10 has I/O areas 12A and 12B, a control circuit area 14, and multiple bank areas 16. In this embodiment, the non-volatile semiconductor memory device 10 has four bank areas 16, that is, $0^{th}$ through $3^{rd}$ bank areas 16[0] through 16[3]. Each bank area 16 is portrait in the first direction A or the column direction as its longitudinal direction. The $0^{th}$ through the $3^{rd}$ bank areas 16 are arrayed in the second direction B or in the row direction.

Figure 9:
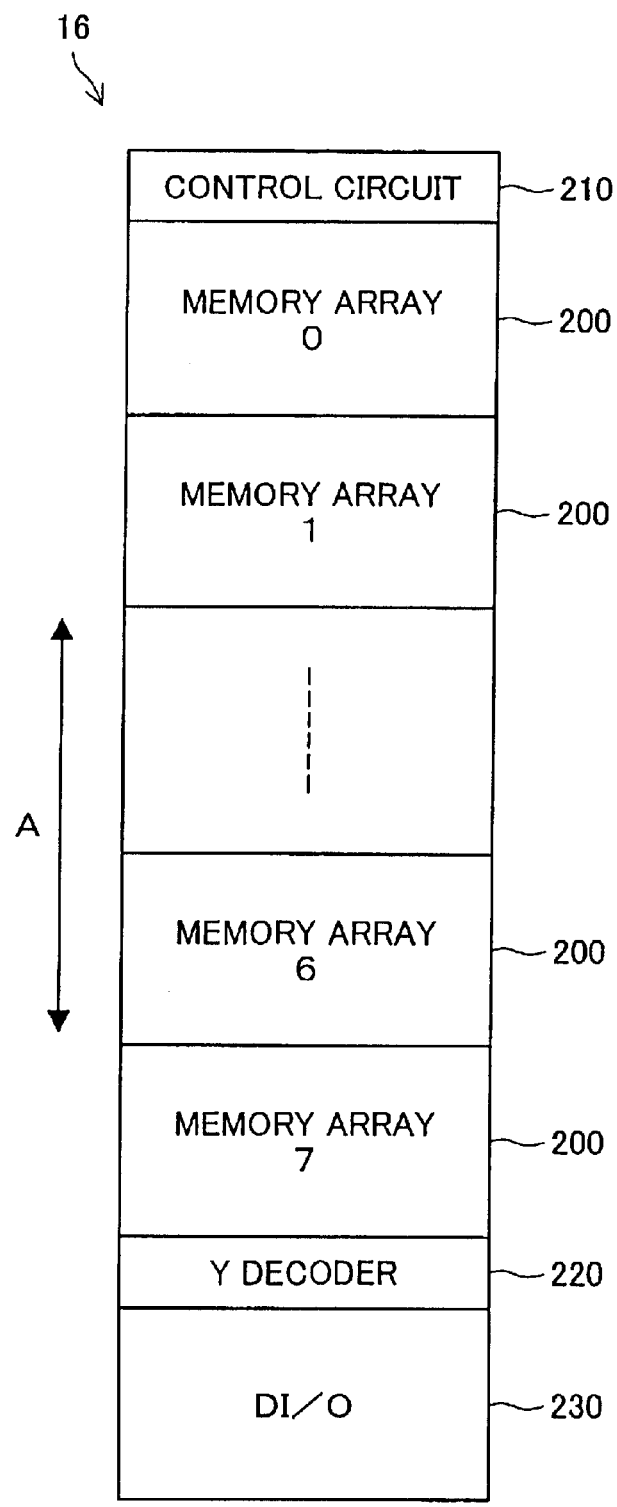
FIG. 9 is a plan view schematically illustrating the structure of each bank area shown in FIG. 8.

FIG. 9 is a plan view schematically illustrating the structure of each bank area 16 shown in FIG. 8. Each bank area 16 has a control circuit region 210, multiple memory array regions 200, a Y decoder region 220, and a data I/O (DI/O) region 230. In this embodiment, each bank area 16 has eight memory array regions 200, that is, $0^{th}$ through $7^{th}$ memory array regions 200[0] through 200[7].

Figure 10:
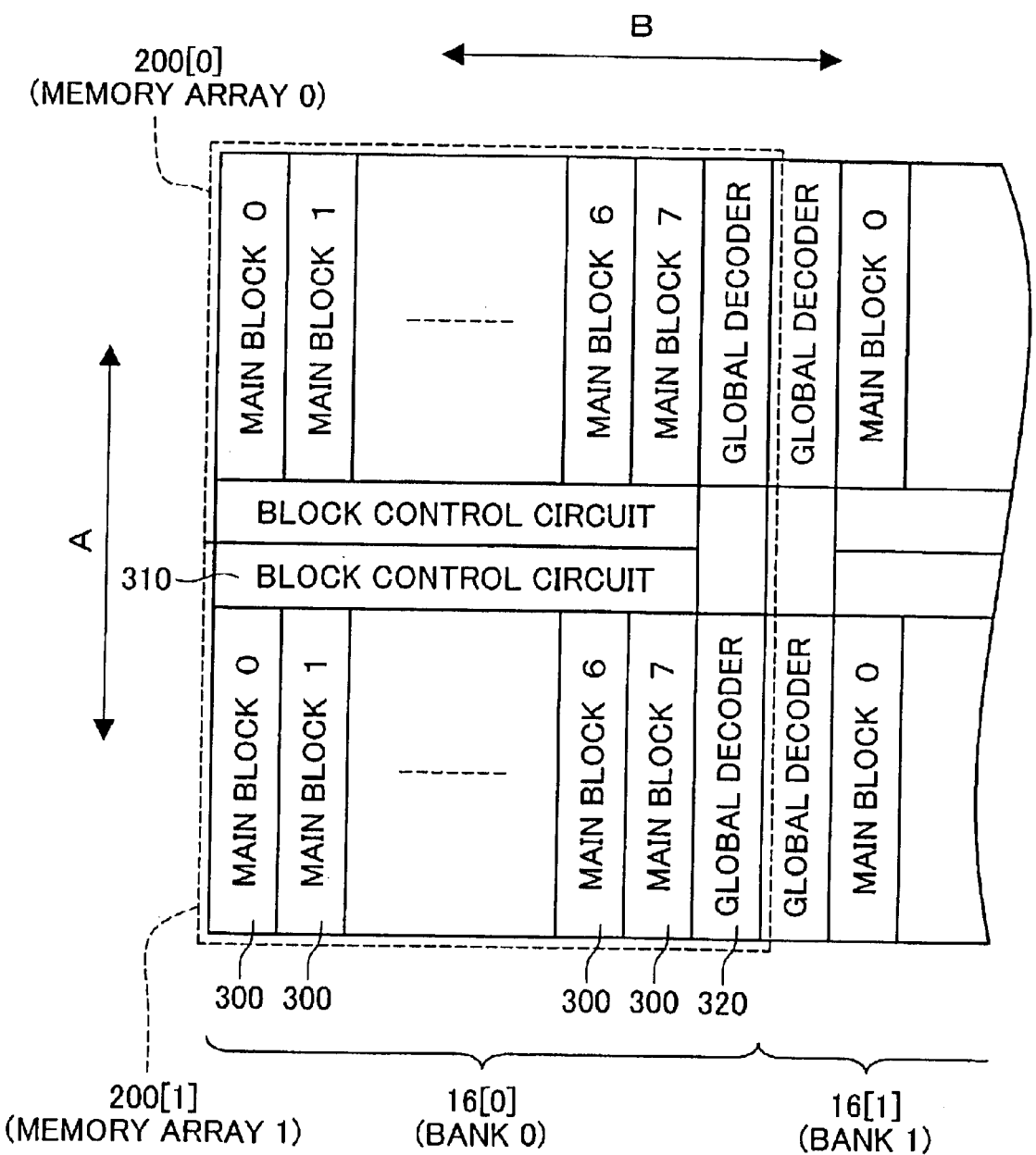
FIG. 10 is a plan view schematically illustrating the structure of two adjoining memory array regions, $0^{th}$ and the $1^{st}$ memory array regions shown in FIG. 9.

FIG. 10 is a plan view schematically illustrating the structure of two adjoining memory array regions 200, the $0^{th}$ and the $1^{st}$ memory array regions 200[0] and 200[1] shown in FIG. 9. Each memory array region 200 has multiple main block areas 300 arrayed in the second direction B, a block control circuit area 310, and a global decoder area 320. In this embodiment, the memory array region 200 has eight main block areas 300, that is, $0^{th}$ through $7^{th}$ main block areas 300[0] through 300[7]. The block control circuit areas 310 of the adjoining $0^{th}$ and $1^{st}$ memory array regions 200[0] and 200[1] are arranged between the respective main block areas 300 to be adjacent to each other in the first direction A. The block control circuit areas 310 are arranged in this manner with regard to all of the adjoining $2^{nd}$ and $3^{rd}$ memory array regions 200[2] and 200[3], the adjoining $4^{th}$ and $5^{th}$ memory array regions 200[4] and 200[5], and the adjoining $6^{th}$ and $7^{th}$ memory array regions 200[6] and 200[7]. The global decoder areas 320 of the adjoining memory array regions 200 in the $0^{th}$ and the $1^{st}$ bank areas 16[0] and 16[1] are arranged between the respective main block areas 300 to be adjacent to each other in the second direction B. The global decoder areas 320 of the adjoining memory regions 200 are arranged in this manner with regard to the $2^{nd}$ and the $3^{rd}$ bank areas 16[2] and 16[3].

FIGS. 11(A) and 11(B) are plan views schematically illustrating the structure of each main block area 300 shown in FIG. 10. Each main block area 300 is divided into multiple sub-block areas 400 arrayed in the first direction A as shown in FIG. 11(A). In this embodiment, the main block area 300 is divided into eight sub-block areas 400, that is, $0^{th}$ through $7^{th}$ sub-block areas 400[0] through 400[7]. Each sub-block area 400 is further divided into multiple small block sections 410 arrayed in the first direction A as shown in FIG. 11(B). In this embodiment, the sub-block area 400 is divided into four small block sections 410, that is, $0^{th}$ through $3^{rd}$ small block sections 410[0] through 410[3].

Figure 11:
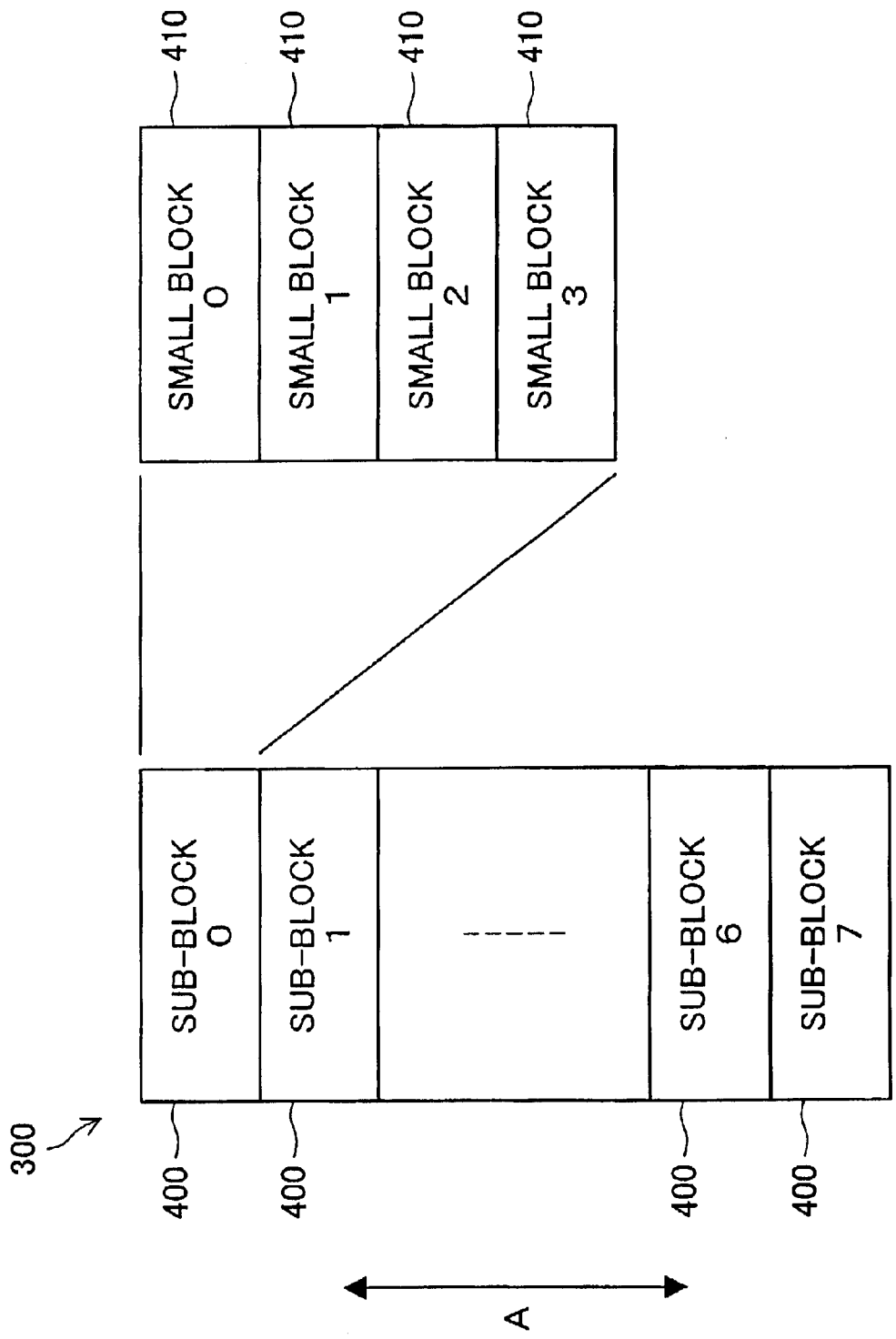
FIGS. 11(A) and 11(B) are plan views schematically illustrating the structure of each main block area shown in FIG. 10.
Figure 12:
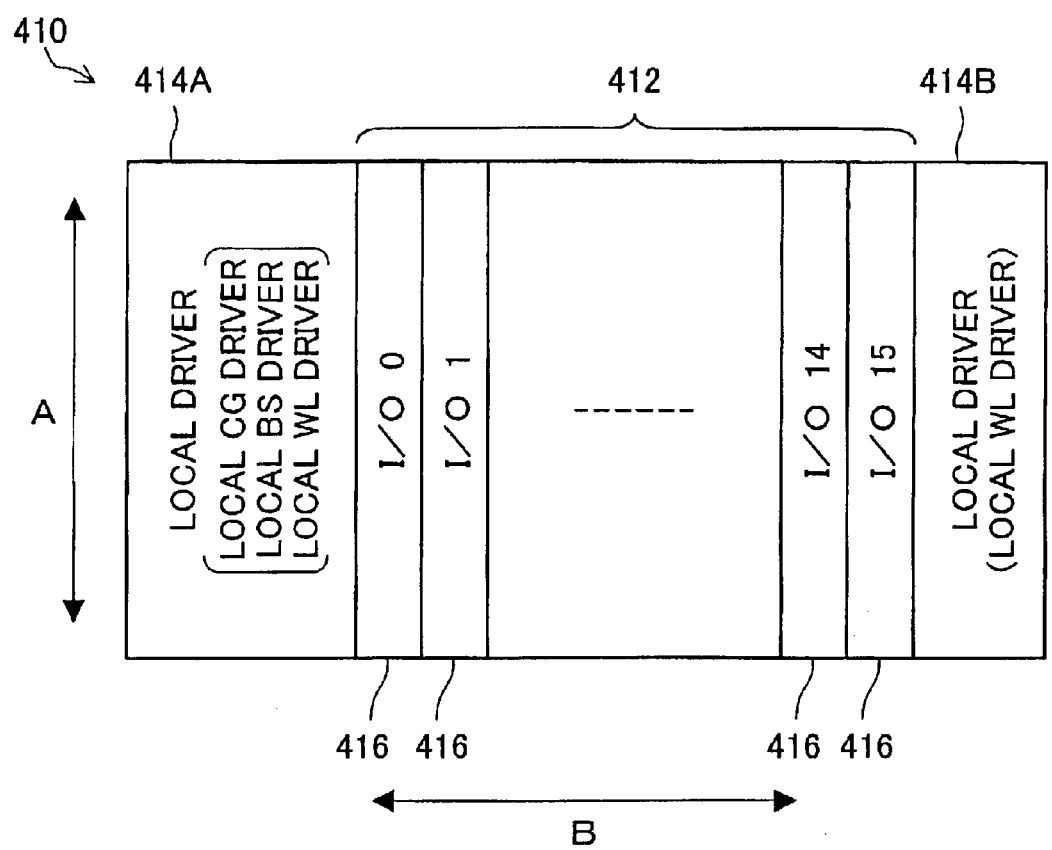
FIG. 12 is a plan view schematically illustrating the structure of each small block section shown in FIG. 11.

FIG. 12 is a plan view schematically illustrating the structure of each small block section 410 shown in FIG. 11. Each small block section 410 has a small array area 412 and first and second local driver areas 414A and 414B on both sides of the small array area 412 in the second direction B. The small array area 412 is divided into 16 memory blocks 416[0] through 416[15] corresponding to 16-bit data I/O0 through I/O15, that is, memory blocks corresponding to input/output bits, in the second direction B. The first local driver area 414A includes a local control gate (local CG) driver, a local bit line selection (local BS) driver, and a local word line (local WL) driver. The second local driver area 414B includes a local word line (local WL) driver.

As discussed later, each memory block 416 consists of 8 twin memory cells in the row direction or in the second direction B and 64 twin memory cells (that is, 64 word lines WL) in the column direction or in the first direction A. Namely each memory block 416 has a storage capacity of 1 kilobit (8×64×2=1024).

Each small block section 410 includes 16 memory blocks 416 as shown in FIG. 12 and accordingly has a storage capacity of 16 kilobits (1024×16=16384). Each sub-block area 400 includes four small block sections 410 as shown in FIG. 11(B) and accordingly has a storage capacity of 64 kilobits (16384×4=65536). Each main block area 300 includes eight sub-block areas 400 as shown in FIG. 11(A) and accordingly has a storage capacity of 512 kilobits (65536×8=524288). Each memory array region 200 includes eight main block areas 300 as shown in FIG. 10 and accordingly has a storage capacity of 4 M bits (524288×8=4194304). Each bank area 16 includes eight memory array regions 200 as shown in FIG. 9 and accordingly has a storage capacity of 32 M bits (4194304×8=33554432). The non-volatile semiconductor memory device 10 includes four bank areas 16 as shown in FIG. 8 and accordingly has a storage capacity of 128 M bits (33554432×4=134217728).

In the above discussion, the terms 'area', 'region', and 'section' are used to explain the layout of the respective components in the one-chip non-volatile semiconductor memory device 10. In the discussion given below on the functions of the respective components, the components without the terms 'area', 'region', and 'section' may be expressed by the same numerals.

B2. Functional Structure

FIG. 13 shows meanings of a 23-bit address signal A<22:0> input into the non-volatile semiconductor memory device 10. In response to an upper-most 2-bit address signal A<22:21>, one bank is selected among the four banks, the $0^{th}$ through the $4^{th}$ banks (see FIG. 8). In response to a next 3-bit address signal A<20:18>, one memory array is selected among the eight memory arrays, the $0^{th}$ through the $7^{th}$ memory arrays (see FIG. 9), in the selected bank. In response to a further next 3-bit address signal A<17:15>, one main block is selected among the eight main blocks, the $0^{th}$ through the $7^{th}$ main blocks (see FIG. 10), in the selected memory array. In response to a next 3-bit address signal A<14:12>, one sub-block is selected among the eight sub-blocks, the $0^{th}$ through the $7^{th}$ sub-blocks (see FIG. 11(A)), in the selected main block. In response to a next 2-bit address signal A<11:10>, one small block is selected among the four small blocks, the $0^{th}$ through the $3^{rd}$ small blocks (see FIG. 11(B)), in the selected sub-block. In response to a further next 2-bit address signal A<9:8>, four columns of memory elements are selected among 16 columns of memory elements in each of the 16 memory blocks corresponding to the 16-bit data I/O0 through I/O15 in the selected small block. In response to a lower-most 2-bit address signal A<1:0>, one column of memory elements is selected among the four columns of memory elements selected by the address signal A<9:8>. In response to a 6-bit address signal A<7:2> between the address signals A<9:8> and A<1:0>, one row is selected among 64 rows (that is, 64 word lines WL) in the selected small block.

These address settings are only an example and are not restrictive at all. A variety of arbitrary settings are allowed.

Figure 14:
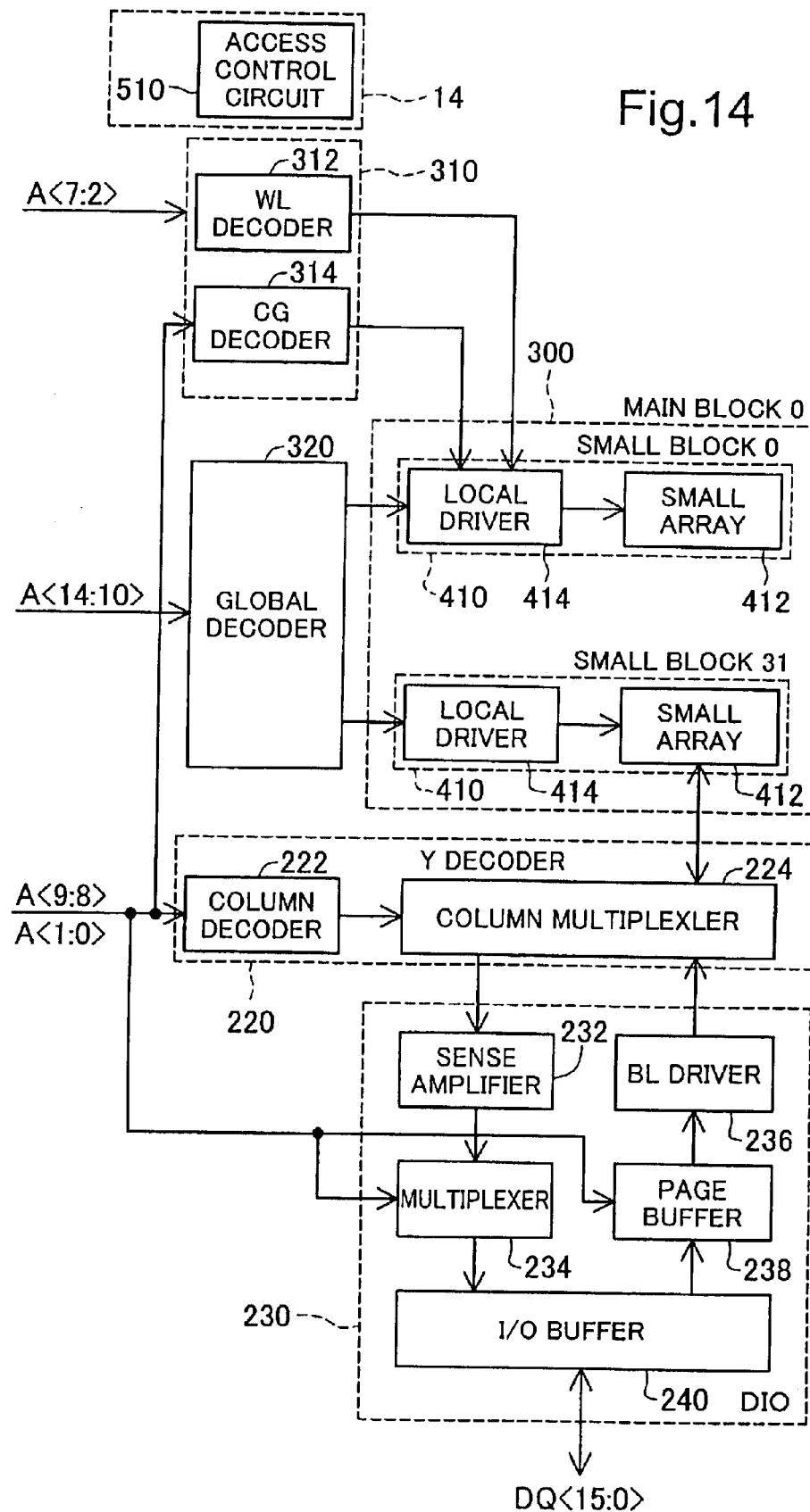
FIG. 14 is a block diagram showing the functional structure of the non-volatile semiconductor memory device.

FIG. 14 is a block diagram showing the functional structure of the non-volatile semiconductor memory device 10. This functional block diagram regards one main block 300 (the main block 0 in this example), which is selected by an upper 8-bit address signal A<22:15> (not shown) of the 23-bit address signal A<22:0> described above.

The 5-bit sub-block-selecting and small block-selecting address signal A<14:10> is input into the global decoder 320. The 6-bit word line-selecting address signal A<7:2> is input into a word line (WL) decoder 312 of the block control circuit 310. The 2-bit first column-selecting address signal A<9:8> and the 2-bit second column-selecting address signal A<1:0> are input into a control gate line (CG) decoder 314 of the block control circuit 310, a column decoder 222 of the Y decoder 220, and a multiplexer 234 and a page buffer 238 of the data I/O 230.

The global decoder 320 outputs a decode signal to the local driver 414 of each small block 410 to select only one small block 410 among $0^{th}$ through $31^{st}$, 32 small blocks 410, in response to the input 5-bit sub-block-selecting and small block-selecting address signal A<14:10>

The WL decoder 312 of the block control circuit 310 outputs a decode signal to the local driver 414 of each small block 410 to select only one word line among 64 word lines WL0 through WL63, in response to the input word line-selecting address signal A<7:2>.

The CG decoder 314 of the block control circuit 310 outputs a decode signal to the local driver 414 of each small block 410 to actuate eight control gate lines CG0 through CG7 (sub-control gate lines SCG0 through SCG7), in response to the input 2-bit first column-selecting address signal A<9:8> and the input 2-bit second column-selecting address signal A<1:0>.

The local driver 414 of each small block 410 controls the state of the word lines WL0 through WL63, the control gate lines CG0 through CG7, and bit lines BL0 through BL130 in response to the input decode signals, so as to regulate the operation of the small array 412 of the selected small block 410.

The column decoder 222 of the Y decoder 220 outputs a decode signal to actuate a column multiplexer 224, in response to the input 2-bit first column-selecting address signal A<9:8> and the input 2-bit second column-selecting address signal A<1:0>.

The column multiplexer 224 controls connection of the bit lines BL0 through BL130 in the small array 412 of the selected small block with a sense amplifier 232 or a bit line (BL) driver 236 included in the data I/O 230, in response to the input decode signal.

An access control circuit 510 regulates the respective blocks including the WL decoder 312, the CG decoder 314, the global decoder 320, and the column decoder 222 according to the reading, writing, or erasing operation, so as to control the state of the word lines WL0 through WL63, the control gate lines CG0 through CG7, and the bit lines BL0 through BL130. This access control circuit 510 is also included in the control circuit 14 (see FIG. 8).

In the case of reading data from the selected small array 412, 4-bit data or 4-word read data specified by the 2-bit first column-selecting address signal A<9:8> are collectively output from each of the memory blocks 416[0] through 416[15] corresponding to the 16-bit data I/O0 through I/O16 in the selected small array 412, as described below. The output 4-word read data are input into the sense amplifier 232 of the data I/O 230 via the column multiplexer 224 of the Y decoder 220. The 4-word read data subjected to waveform shaping executed by the sense amplifier 232 are input into the multiplexer 234.

The multiplexer 234 selects one-word read data among the input 4-word read data, in response to the input 2-bit first column-selecting address signal A<9:8> and the input 2-bit second column-selecting address signal A<1:0>. The selected one-word read data is output via an I/O buffer 240.

In the case of inputting the address signal A<22:0> where only the 2-bit second column-selecting address signal A<1:0> sequentially varies from 0 to 3, the procedure collectively reads 4-word data at the time of first input of the address signal A<22:0> and registers the 4-word data into a temporary buffer included in either the multiplexer 234 or the sense amplifier 232. The multiplexer 234 sequentially selects and outputs 1-word data according to the value of the 2-bit second column-selecting address signal A<1:0>.

In the case of programming data by the unit of one word into the selected small array 412, the procedure writes program data, which have been input via the I/O buffer 240 of the data I/O 230, into a corresponding one-word MONOS memory element in the selected small array 412, that is, into each one-bit MONOS memory element in each of the memory blocks 416 corresponding to the 16-bit data I/O0 through I/O15, via the page buffer 238, the bit line (BL) driver 236, and the column multiplexer 224.

In the case of programming data by the unit of multiple words into the selected small array 412, that is, in the case of page buffer programming, 4-word program data are sequentially registered into the page buffer 238 via the I/O buffer 240 of the data I/O 230. First 2-word program data out of the 4-word program data registered in the page buffer 238 are written into corresponding 2-word MONOS memory elements in the selected small array 412, that is, into 2-bit MONOS memory elements in each of the memory blocks 416 corresponding to the 16-bit data I/O0 through I/O15, via the BL driver 236 and the column multiplexer 224, as described later. The residual 2-word program data are then written into corresponding 2-word MONOS memory elements in a similar manner.

B3. Structure of Small Array

Figure 15:
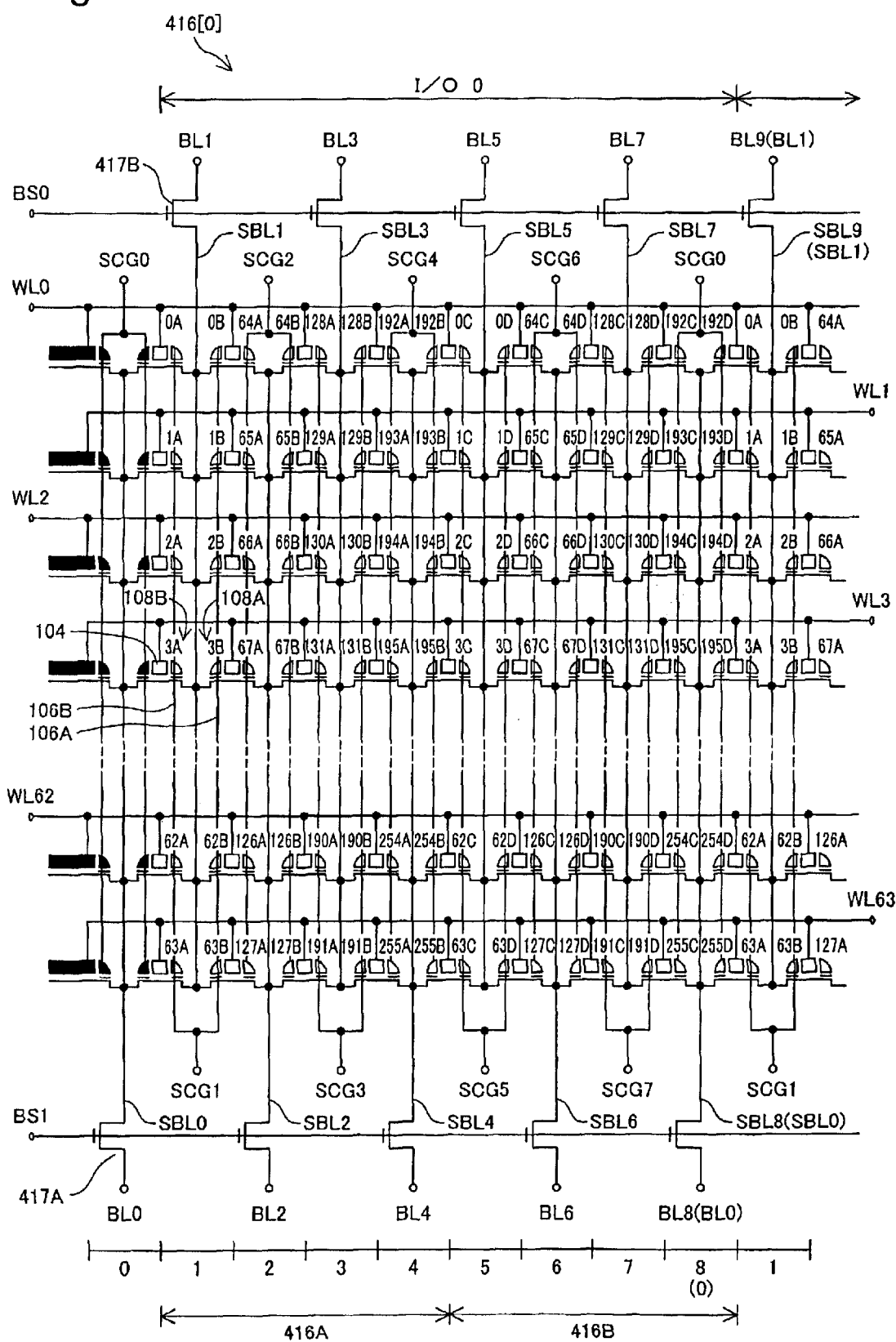
FIG. 15 shows details of a memory block 416[0] corresponding to I/O0 in the small array.

The small array 412 has the 16 memory blocks 416[0] through 416[15] corresponding to the 16-bit data I/O0 through I/O15 arrayed in the row direction, as described previously. FIG. 15 shows details of the memory block 416[0] corresponding to I/O0 in the small array 412. As shown in FIG. 15, the memory block 416[0] consists of 8 twin memory cells in the row direction and 64 twin memory cells in the column direction. These numbers are counted on the assumption that each twin memory cell includes the left memory element 108B and the right memory element 108A adjoining to each other and sharing one sub-bit line SBL.

A dummy twin memory cell DM with two dummy memory elements DMA and DMB is set on the left end of each row in the left-end memory block 416[0] corresponding to I/O0. The dummy twin memory cell DM is also set on the right end of each row in the right-end memory block 416[15] corresponding to I/O15. In the other memory blocks corresponding to I/O1 through I/O14, the adjoining twin memory cells 100 in each left-hand memory block and each right-hand memory block function as the dummy twin memory cells DM.

One memory block 416 is connected with eight sub-control gate lines SCG0 through SCG7 and eight sub-bit lines SBL0 through SBL7 corresponding to the 8 columns of twin memory cells 100 and with 64 word lines WL0 through WL63 corresponding to the 64 rows of twin memory cells 100.

The word lines WL0 through WL63 are shared by the 16 memory blocks 416 and are linked with the local WL drivers (not shown). The respective word lines WL0 through WL63 are driven by the local WL drivers.

The second control gates 106B and the first control gates 106A of multiple twin memory cells 100 arrayed in the row direction on each column are commonly connected to the corresponding one of the sub-control gate lines SCG0 through SCG7. In the left-end memory block 416[0] corresponding to I/O0, the dummy twin memory cells DM correspond to the $0^{th}$ column of twin memory cells 100. The sub-control gate line SBL0 is connected with the first and the second control gates 106A and 106B controlling the two dummy memory elements DMA and DMB. In the other memory blocks 416[1] through 416[15] corresponding to I/O1 through I/O15, the $8^{th}$ column of twin memory cells 100 in each left-hand memory block correspond to the $0^{th}$ column of twin memory cells 100.

The 16 sub-control gate lines SCG0 of the 16 memory blocks 416 arrayed in the row direction are commonly connected to the control gate line CG0 (not shown). Similarly the 16 sub-control gate lines SCG1, the 16 sub-control gate lines SCG2, the 16 sub-control gate lines SCG3, the 16 sub-control gate lines SCG4, the 16 sub-control gate lines SCG5, the 16 sub-control gate lines SCG6, and the 16 sub-control gate lines SCG7 are commonly connected to the control gate line CG1, the control gate line CG2, the control gate line CG3, the control gate line CG4, the control gate line CG5, the control gate line CG6, and the control gate line CG7, respectively. The eight control gate lines CG0 through CG7 are connected to the local CG drivers (not shown) and are driven by the local CG drivers.

The sub-bit lines SBL0 through SBL7 correspond to the impurity layers 110 of the first MONOS memory elements 108A and the second MONOS memory elements 108B in multiple twin memory cells 100 arrayed in the row direction on the respective corresponding columns, and are respectively connected to the bit lines BL0 through BL7. Bit line-selecting gates 417A are located between the even-numbered sub-bit lines SBL0, SBL2, SBL4, and SBL6 and the corresponding even-numbered bit lines BL0, BL2, BL4, and BL6. The respective bit line-selecting gates 417A are commonly connected to a bit line-selecting line BS1. Bit line-selecting gates 417B are located between the odd-numbered sub-bit lines SBL1, SBL3, SBL5, and SBL7 and the corresponding odd-numbered bit lines BL1, BL3, BL5, and BL7. The respective bit line-selecting gates 417B are commonly connected to a bit line-selecting line BS0. The bit line-selecting lines BS1 and BS0 are connected to the local BS drivers (not shown), and the respective bit line-selecting gates 417A and 417B are driven by the local BS drivers.

In the above description, for matter of convenience, the eight sub-bit lines and the eight bit lines in the respective 16 memory blocks 416[0] through 416[15] are expressed by the same symbols SBL0 through SBL7 and BL0 through BL7. This does not mean that the bit lines or the sub-bit lines of an identical symbol are connected commonly. The bit lines and the sub-bit lines are separated in each memory block.

C. Address Settings of Memory Elements

The following describes address settings of the memory elements in each of the 16 memory blocks 416[0] through 416[15] in each small array 412.

The address settings of the memory elements are identical in all the 16 memory blocks 416[0] through 416[15] in each small array 412. The description accordingly regards only the address settings in the small block 416[0]. FIG. 16 shows memory elements (selected memory elements) corresponding to the 2-bit first column-selecting address signal A<9:8> and the 6-bit word line (WL)-selecting address signal A<7:2>.

In response to the 6-bit word line-selecting address signal A<7:2>, one word line is selected among the 64 word lines (rows) WL0 through WL63 as shown in FIG. 16. More specifically, the word line WL0, WL1, WL2, . . . , or WL63 is selectable according to the value 0, 1, 2, . . . , 63 of the address signal A<7:2>. Selection of the word line WL is implemented by application of a preset word line-selecting voltage as discussed previously in the reading principle. Eight twin memory cells 100 arrayed on each row are connected to one word line WL via the respective word gates 104 as shown in FIG. 15. Each twin memory cell 100 has two MONOS memory elements. Selection of one word line WL causes at least one MONOS memory element to be set in a selectable state, among 16-bit (=8×2 bits) MONOS memory elements.

In response to the 2-bit first column-selecting address signal A<9:8>, two columns of twin memory cells 100 are selected among eight columns of twin memory cells 100. More specifically, the $1^{st}$ and the $5^{th}$ columns of twin memory cells 100 are selected when the value of the first column-selecting address signal A<9:8> is equal to 0. In a similar manner, the $2^{nd}$ and the $6^{th}$ columns of twin memory cells 100, the $3^{rd}$ and the $7^{th}$ columns of twin memory cells 100, and the $4^{th}$ and the $8^{th}$ columns of twin memory cells 100 are selected according to the value of the address signal A<9:8>=1, 2, and 3, respectively. Namely each memory block 416 is divided into a first column block 416A in which one column is selected among the $1^{st}$ through the $4^{th}$ columns and a second column block 416B in which one column is selected among the $5^{th}$ through the $8^{th}$ columns, as shown in FIG. 15. Selection of the two columns of twin memory cells 100 among the eight columns of twin memory cells 100 in response to the 2-bit first column-selecting address signal A<9:8> is implemented according to the settings of the control gate lines CG0 through CG7 and the bit lines BL0 through BL7 as discussed later.

When the value of the first column-selecting address signal A<9:8> is equal to 0, four memory elements connecting with one of the word lines WL0 through WL63 corresponding to the value of the 6-bit word line-selecting address signal A<7:2> varied in the range of 0 to 63 are set in a selectable state, among the multiple memory elements arrayed in the $1^{st}$ and the $5^{th}$ columns. When the value of the first column-selecting address signal A<9:8> varies to 1, four memory elements connecting with one of the word lines WL0 through WL63 corresponding to the value of the 6-bit word line-selecting address signal A<7:2> varied in the range of 0 to 63 are set in a selectable state, among the multiple memory elements arrayed in the $2^{nd}$ and the $6^{th}$ columns. In response to a sequential variation of the 10-bit address signal A<9:0>, the procedure successively selects twin memory cells of different rows on an identical column and then newly selects a different column. The procedure successively selects twin memory cells of different rows on the newly selected column.

For example, when the value of the 2-bit first column-selecting address A<9:8> is equal to 0 and the value of the 6-bit word line-selecting address A<7:2> is also equal to 0, the selected word line is the $1^{st}$ word line WL0. Four MONOS memory elements 0A, 0B, 0C, and 0D on the $1^{st}$ row in the $1^{st}$ column of the first column block 416A and in the 5$^{th}$ column of the second column block 416B are set in the selectable state. Here when the value of the 6-bit word line-selecting address A<7:2> is equal to 63, the selected word line is the 64$^{th}$ word line WL63. Four MONOS memory elements 63A, 63B, 63C, and 63D on the 64$^{th}$ row in the 1$^{st}$ column of the first column block 416A and in the 5$^{th}$ column of the second column block 416B are set in the selectable state. In another example, when the value of the 2-bit first column-selecting address A<9:8> is equal to 1 and the value of the 6-bit word line-selecting address A<7:2> is equal to 0, the selected word line is the 1$^{st}$ word line WL0. Four MONOS memory elements 64A, 64B, 64C, and 64D on the 1$^{st}$ row in the 2$^{nd}$ column of the first column block 416A and in the 6$^{th}$ column of the second column block 416B are set in the selectable state. Here when the value of the 6-bit word line-selecting address A<7:2> is equal to 63, the selected word line is the 64$^{th}$ word line WL63. Four MONOS memory elements 127A, 127B, 127C, and 127D on the 64$^{th}$ row in the 2$^{nd}$ column of the first column block 416A and in the 6$^{th}$ column of the second column block 416B.

The four memory elements of the twin memory cells 100 in the two columns set in the selectable state according to the value of the 2-bit first column-selecting address A<9:8> are expressed as '*A', '*B', '*C', and '*D' sequentially from the left. Numerals of 0 to 255 are allocated to the asterisks '***' according to the value of the total 8-bit address signal A<9:2> including the 2-bit first column-selecting address A<9:8> and the 6-bit word line-selecting address A<7:2>. The letters 'A' through 'D' correspond to the values 0 to 3 of the lower-most 2-bit second column-selecting address signal A<1:0>.

In this embodiment, the 2-bit address A<9:8> is set to the first column-selecting address. In response to a sequential variation of the 10-bit address signal A<9:0>, the procedure of this embodiment successively selects twin memory cells of different rows on an identical column and then newly selects a different column. These settings are, however, not restrictive at all. Another 2-bit address A<3:2> may be set to the first column-selecting address, while a 6-bit address A<9:4> is set to the word line-selecting address. In this modified arrangement, in response to a sequential variation of the 10-bit address signal A<9:0>, the procedure successively selects twin memory cells of different columns on an identical row and then newly selects a different row.

D. Reading Operation

The following describes a data reading operation in the non-volatile semiconductor device 10 of the embodiment.

The operations of the respective memory blocks 416[0] through 416[15] in each small array 412 selected in the data reading process are basically the same. The following discussion thus regards the operation of one memory block 416.

Figure 17:
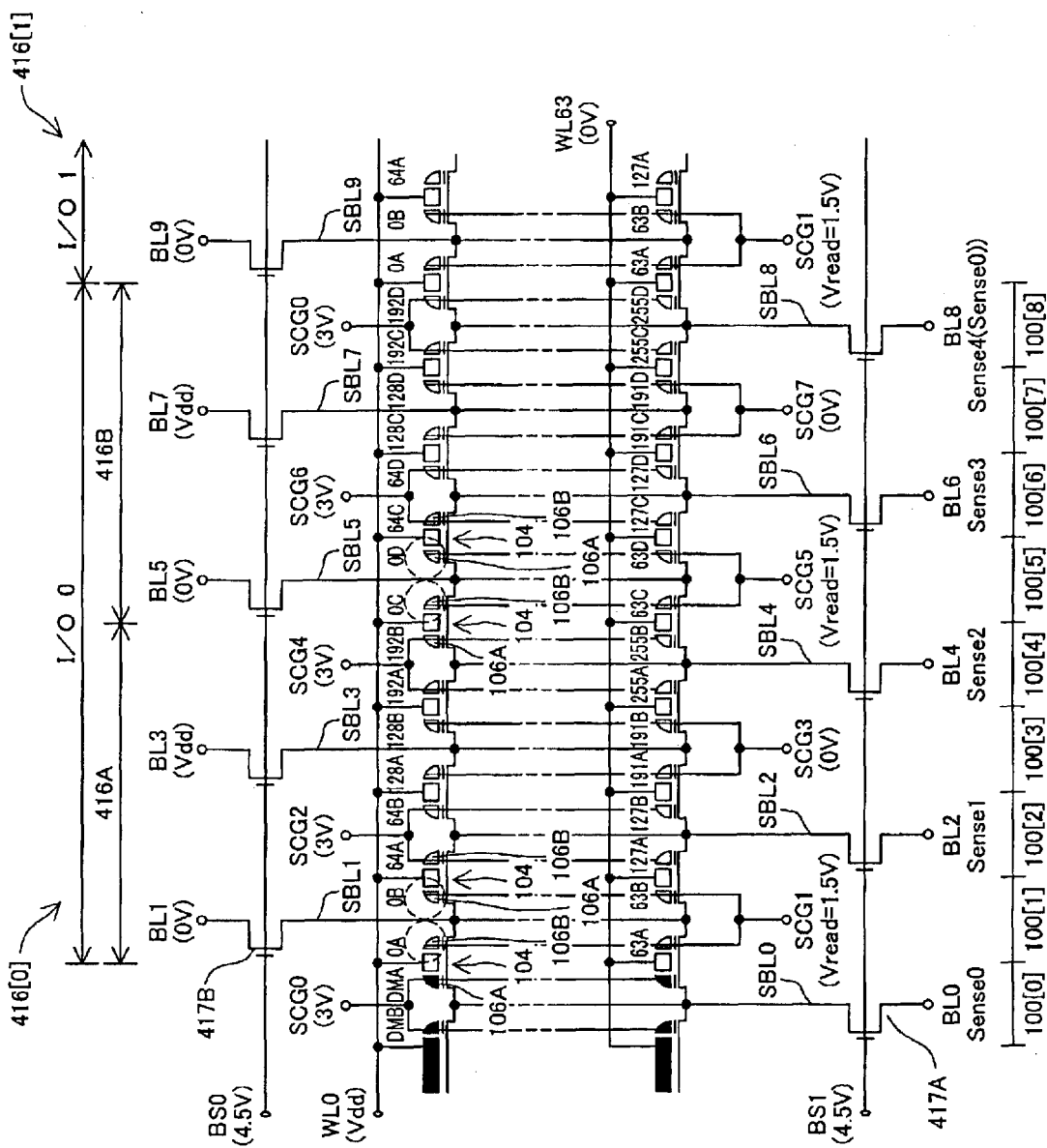
FIG. 17 shows a process of reading 4-bit data in a reverse mode from two MONOS memory elements 0A and 0B of a twin memory cell 100[1] on a first column and from two MONOS memory elements 0C and 0D of a twin memory cell 100[5] on a fifth column, which are connected with a word line WL0.

FIG. 17 shows a process of reading 4-bit data in a reverse mode from two MONOS memory elements 0A and 0B (selected memory elements) of a twin memory cell 100[1] on the first column and from two MONOS memory elements 0C and 0D (selected memory elements) of a twin memory cell 100[5] on the fifth column, which are connected with the word line WL0.

Data are read from the two MONOS memory elements 0A and 0B of the twin memory cell 100[1] on the first column in the first column block 416A, as discussed below.

The procedure first applies a power supply voltage Vdd (for example, 1.8 V) as the reading word line-selecting voltage to the word line WL0, while applying 0 V to the other non-selected word lines WL1 through WL63.

As discussed previously with reference to FIG. 4 as the reading principle, the procedure applies an override voltage (for example, 3 V) via the sub-control gate line SCG0 onto the control gate 106A of the MONOS memory element DMA (opposite memory element) arranged to face the left-side MONOS memory element 0A (selected memory element) in the twin memory cell 100[1] on the first column across the word gate 104.

The procedure also applies a reading voltage Vread (for example, 1.5 V) as the control gate voltage VCG via the sub-control gate line SCG1 to the control gate 106B of the selected memory element 0A.

Referring to FIG. 17, in the data reading process, 0 V is set to the potential of the bit line BL1 connecting with the selected memory element 0A via the sub-bit line SBL1. The bit line BL0 connecting with the opposite memory element DMA via the sub-bit line SBL0 is linked with a corresponding sense amplifier element (Sense0) in the sense amplifier 232 (see FIG. 14). The electric current Ids flows when no electric charge is accumulated in the selected memory element 0A. Electric current accordingly flows through the bit line BL0 connecting with the opposite memory element DMA. No electric current Ids flows, on the other hand, when electric charge is accumulated in the selected memory element 0A. Substantially no electric current accordingly flows through the bit line BL0 connecting with the opposite memory element DMA. Measurement of the electric current flowing through the bit line BL0 connected with the opposite memory element DMA enables data to be read from the left-side MONOS memory element 0A in the twin memory cell 100[1] on the first column.

According to the reading principle of the twin memory cell discussed previously with reference to FIG. 4, in order to read data from the left-side MONOS memory element 0A in the twin memory cell 100[1] on the first column, 0 V is applied via the sub-control gate line SCG2 onto the control gate 106B of the opposite memory element 64A, which is opposed to the right-side MONOS memory element 0B (selected memory element).

In this embodiment, however, as shown in FIG. 17, the override voltage (for example, 3 V) is applied via the sub-control gate line SCG2 onto the control gate 106B of the opposite memory element 64A, which is opposed to the right-side MONOS memory element 0B.

The bit line BL2 connecting with the opposite memory element 64A via the sub-bit line SBL2 is linked with a corresponding sense amplifier element (Sense1) in the sense amplifier 232 (FIG. 14). The electric current Ids flows when no electric charge is accumulated in the selected memory element 0B. Electric current accordingly flows through the bit line BL2 connecting with the opposite memory element 64A. No electric current Ids flows, on the other hand, when electric charge is accumulated in the selected memory element 0B. Substantially no electric current accordingly flows through the bit line BL2 connecting with the opposite memory element 64A. Measurement of the electric current flowing through the bit line BL2 connected with the opposite memory element 64A enables data to be read from the right-side MONOS memory element 0B in the twin memory cell 100[1] on the first column.

The procedure can thus simultaneously select and collectively read the two MONOS memory elements 0A and 0B included in the twin memory cell 100[1] on the first column in the first column block 416A.

The power supply voltage Vdd (for example, 1.8 V) is set to the potential of the bit line BL3 connecting with the two MONOS memory elements 128A and 128B in the twin memory cell 100[3] on the third column, whereas 0 V is set to the potential of the control gate line SCG3 connecting with the control gates 106B and 106A of these MONOS memory elements 128A and 128B.

In the same manner as the first column block 416A, the procedure can read data from the two MONOS memory elements 0C and 0D in the twin memory cell 100[5] on the fifth column in the second column block 416B. The settings of the sub-control gate lines SCG0 through SVCG3 in the first column block 416A are also applied to those of the sub-control gate lines SCG4 through SCG7 in the second column block 416B. The settings of the bit lines BL0 through BL3 in the first column block 416A are also applied to those of the bit lines BL4 through BL7 in the second column block 416B. These settings are described below in detail.

The procedure applies the override voltage (for example, 3 V) via the sub-control gate line SCG4 onto the control gate 106A of the opposite memory element 192B, which is opposed to the left-side MONOS memory element 0C (selected memory element) in the twin memory cell 100[5] on the fifth column. The procedure also applies the override voltage (for example, 3 V) via the sub-control gate line SCG6 onto the control gate 106B of the opposite memory element 64C, which is opposed to the right-side MONOS memory element 0D (selected memory element) in the twin memory cell 100[5] on the fifth column.

The procedure also applies the reading voltage Vread (for example, 1.5 V) via the sub-control gate line SCG5 as the control gate voltage VCG of the control gates 106B and 106A of the selected memory elements 0C and 0D.

As shown in FIG. 17, in the data reading process, 0 V is set to the potential of the bit line BL5 connecting with the selected memory elements 0C and 0D via the sub-bit line SBL5. The bit line BL4 connecting with the opposite memory element 192B, which is opposed to the selected memory element 0C, via the sub-bit line SBL4 is linked with a corresponding sense amplifier element (Sense2) in the sense amplifier 232 (FIG. 14). The bit line BL6 connecting with the opposite memory element 64C, which is opposed to the selected memory element 0D, via the sub-bit line SBL6 is linked with a corresponding sense amplifier element (Sense3) in the sense amplifier 232 (FIG. 14).

The power supply voltage Vdd (for example, 1.8 V) is set to the potential of the bit line BL7 connecting with the two MONOS memory elements 128C and 128D in the twin memory cell 100[7] on the seventh column, whereas 0 V is set to the potential of the control gate line SCG7 connecting with the control gates 106B and 106A of these MONOS memory elements 128C and 128D.

The procedure can thus simultaneously select and collectively read the two MONOS memory elements 0C and 0D included in the twin memory cell 100[5] on the fifth column in the second column block 416B.

In this manner, the procedure can simultaneously select and collectively read the four MONOS memory elements 0A, 0B, 0C, and 0D in the twin memory cell 100[1] on the first column included in the first column block 416A and in the twin memory cell 100[5] on the fifth column included in the second column block 416B in one memory block 416.

As shown in FIG. 17, the bit line-selecting gates (n-type MOS transistors) 417A are connected with the bit lines BL0, BL2, BL4, and BL6 of the even-numbered columns. The bit line-selecting gates 417B are connected with the bit lines BL1, BL3, BL5, and BL7 of the odd-numbered columns. A voltage of, for example, 4.5 V is applied as these gate voltages.

Among the data read from the four MONOS memory elements 0A, 0B, 0C, and 0D (selected memory elements) detected by the corresponding sense amplifier elements (Sense0 through Sense3) in the sense amplifier 232 (FIG. 14), data corresponding to the 2-bit second column-selecting address A<1:0> is selected by the multiplexer 234 (FIG. 14) and is output via the I/O buffer 240. For example, data is read from the MONOS memory element 0A when the value of the address A<1:0> is equal to 0, whereas data is read from the MONOS memory element 0B when the value of the address A<1:0> is equal to 1. In a similar manner, data is read from the MONOS memory element 0C when the value of the address A<1:0> is equal to 2, whereas data is read from the MONOS memory element 0D when the value of the address A<1:0> is equal to 3.

The above description regards the procedure of reading the twin memory cell 100[1] on the first column in the first column block 416A and reading the twin memory cell 100[5] on the fifth column in the second column block 416B. This procedure is also applied to the case of reading the twin memory cell 100[2] on the second column in the first column block 416A and reading the twin memory cell 100[6] on the sixth column in the second column block 416B. Similarly the procedure is applied to the case of reading the twin memory cell 100[3] on the third column in the first column block 416A and reading the twin memory cell 100[7] on the seventh column in the second column block 416B, as well as to the case of reading the twin memory cell 100[4] on the fourth column in the first column block 416A and reading the twin memory cell 100[8] on the eighth column in the second column block 416B.

The above description regards the memory block 416[0] corresponding to I/O0. The identical operation is performed simultaneously with regard to the other memory blocks 416[1] through 416[15] corresponding to I/O1 through I/O15. In the non-volatile semiconductor memory device 10 of this embodiment, one-word (16-bit) DQ<15:0> data are accordingly output via the I/O buffer 240

As described above, in the non-volatile semiconductor device 10 of the embodiment, the data reading process can collectively read data from MONOS memory elements of multiple words (4 words in the above example). Among the collectively read data of multiple words, the data corresponding to the lower-most 2-bit second column-selecting address signal A<1:0> is selected and output.

The non-volatile semiconductor device 10 of the embodiment can thus read the 4-word data at a high speed after specification of an address, while sequentially varying only the column address. This arrangement allows for read access of 4 words per page and thus ensures the high-speed read access in the page mode.

E. Writing Operation

The following describes a data writing or programming operation into the non-volatile semiconductor memory device 10 of this embodiment.

The operations of the respective memory blocks 416[0] through 416[15] in each small array 412 selected in the data writing process are basically the same. The following discussion thus regards the operation of one memory block 416.

The operation of writing or programming data into a 1-bit MONOS memory element in one memory block 416 follows the writing principle of the twin memory cell (see FIG. 6) and is thus not specifically described here. The discussion below thus regards an operation of writing data into 4-bit MONOS memory elements by the 'page buffer writing' function.

Figure 18:
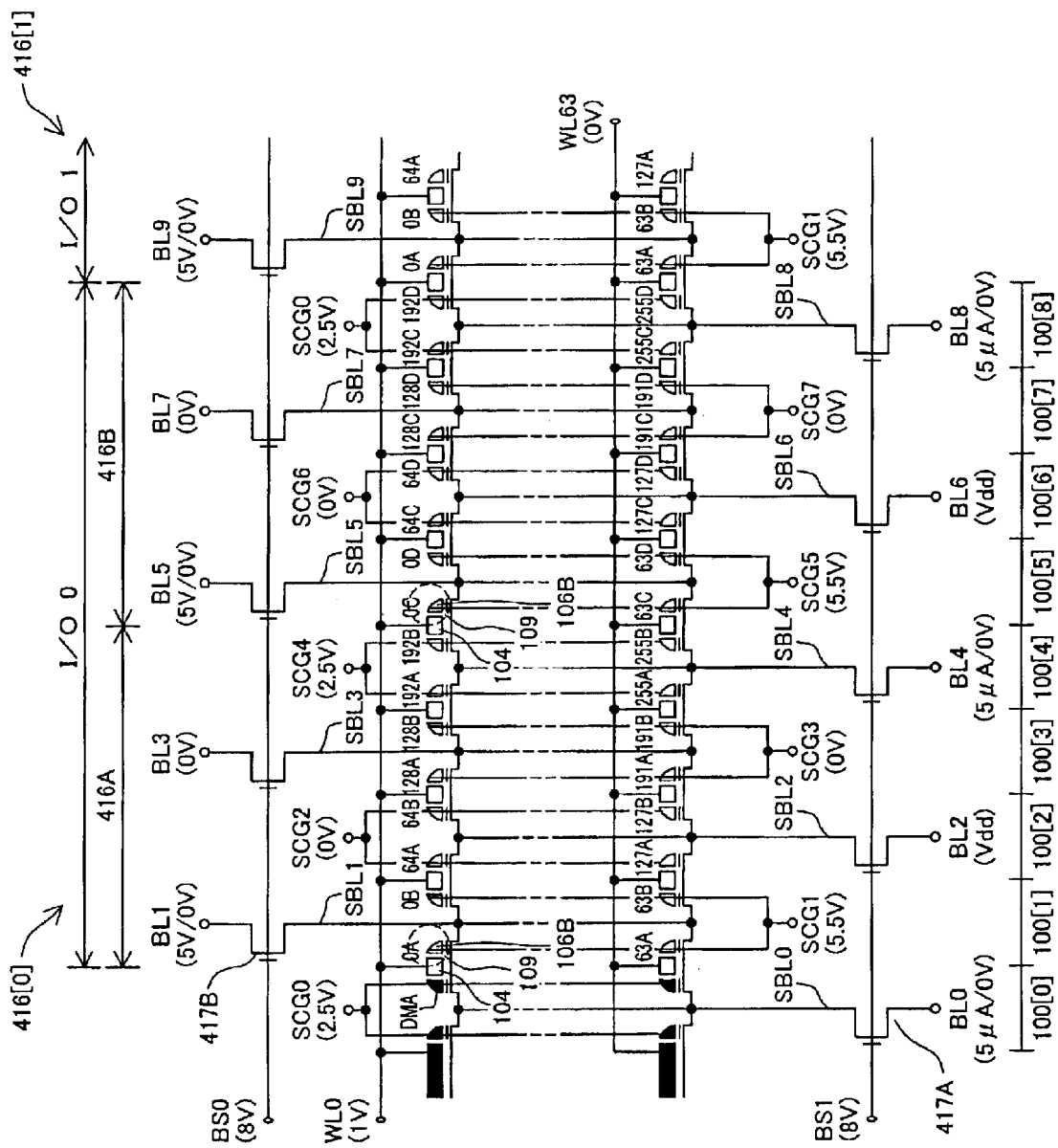
FIG. 18 shows a process of writing data into the MONOS memory element 0A of the twin memory cell 100[1] on the first column and the MONOS memory element 0C of the twin memory cell 100[5] on the fifth column, which are connected with the word line WL0.
Figure 19:
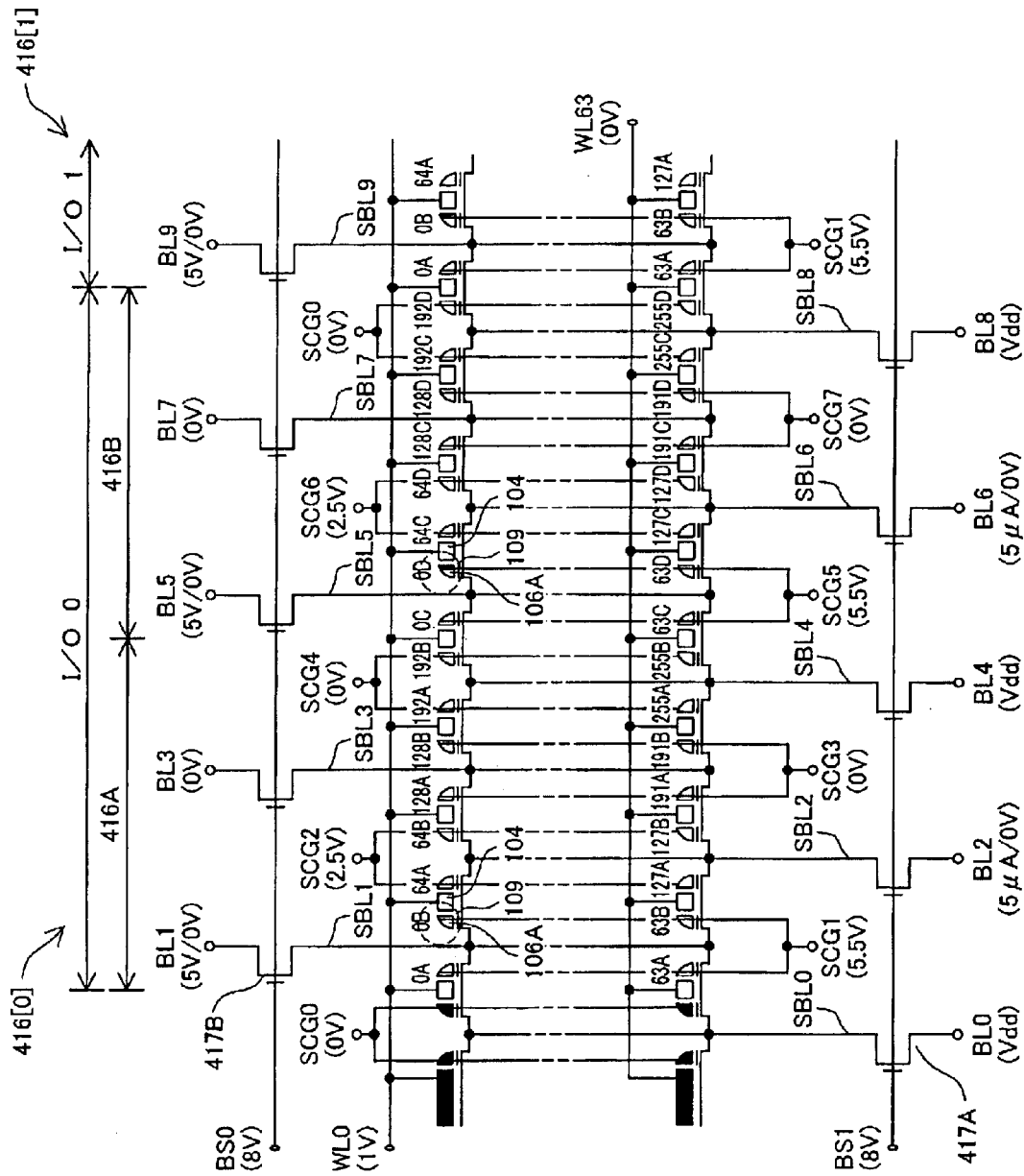
FIG. 19 shows a process of writing data into the MONOS memory element 0B of the twin memory cell 100[1] on the first column and the MONOS memory element 0D of the twin memory cell 100[5] on the fifth column, which are connected with the word line WL0.

FIG. 18 shows a process of writing data into the MONOS memory element 0A of the twin memory cell 100[1] on the first column and the MONOS memory element 0C of the twin memory cell 100[5] on the fifth column, which are connected with the word line WL0. FIG. 19 shows a process of writing data into the MONOS memory element 0B of the twin memory cell 100[1] on the first column and the MONOS memory element 0D of the twin memory cell 100[5] on the fifth column, which are connected with the word line WL0.

In the case of writing data into the four MONOS memory elements 0A, 0B, 0C, and 0D by the 'page buffer writing' function, the procedure writes data first into the two MONOS memory elements 0A and 0C as shown in FIG. 18 and then into the other two MONOS memory elements 0B and 0D as shown in FIG. 19.

Prior to such data writing operation, the data, which are to be written into the MONOS memory elements 0A, 0B, 0C, and 0D corresponding to consecutive four address signals, have been registered in the page buffer 238 via the I/O buffer 240 (see FIG. 14). The data erasing operation is carried out before the data programming operation. The data erasing operation follows the erasing principle of the twin memory cell discussed previously and is thus not specifically described here.

In the process of writing data in the page buffer, each memory block 416 is divided into the first column block 416A in which one column is selected among $1^{st}$ through $4^{th}$ columns and the second column block 416B in which one column is selected among $5^{th}$ through $8^{th}$ columns, as shown in FIGS. 18 and 19.

In the state of FIG. 18, data are written into the left-side MONOS memory element 0A of the twin memory cell 100[1] on the first column in the first column block 416A and into the left-side MONOS memory element 0C of the twin memory cell 100[5] on the fifth column in the second column block 416B. The data writing process is divided into a data writing process in the first column block 416A and a data writing process in the second column block 416B. The discussion first regards the data writing process in the first column block 416A.

The procedure applies a voltage lower than the power supply voltage Vdd, for example, a voltage of about 1.0 V, to the word line WL0 as the programming word line-selecting voltage, while applying 0 V to the other non-selected word lines WL1 through WL63.

As discussed previously with reference to FIG. 6 as the writing principle of the twin memory cell, the procedure applies an override voltage (for example, 2.5 V) via the sub-control gate line SCG0 onto the control gate 106A of the opposite memory element DMA arranged to face the left-side MONOS memory element 0A (selected memory element) of the twin memory cell 100[1] on the first column across the word gate 104.

The procedure also applies a writing voltage Vwrite (for example, 5.5 V) as the programming control gate voltage via the sub-control gate line SCG1 to the control gate 106B of the selected memory element 0A.

The potentials of the other sub-control gate lines SCG2 and SCG3 are set equal to 0 V.

A programming bit line voltage of, for example, 5 V is set to the potential of the bit line BL1, which is connected with the selected memory element 0A via the sub-bit line SBL1. The power supply voltage Vdd (for example, 1.8 V) is set to the potential of the bit line BL2. The other bit lines BL0 and BL3 are connected to a current generator (not shown). The memory elements 128A and 128B connecting with the bit line BL3 are set OFF, since the potential of the corresponding sub-control gate line SCG3 is equal to 0 V. No electric current thus flows and 0 V is set to the bit line BL3 via the current generator.

Under such settings, an electric current Ids of approximately 5 $\mu$A flows through the selected memory element 0A from the bit line BL1 to the bit line BL0, while channel hot electron (CHE) is trapped by the ONO film 109 of the selected MONOS memory element 0A. The data programming operation of the selected MONOS memory element 0A is implemented in this manner, and data '0' is written into the selected memory element 0A.

In the same manner as the first column block 416A, the procedure can implement the data programming or writing operation into the left-side MONOS memory element 0C of the twin memory cell 100[5] on the fifth column in the second column block 416B. The settings of the sub-control gate lines SCG0 through SVCG3 in the first column block 416A are also applied to those of the sub-control gate lines SCG4 through SCG7 in the second column block 416B. The settings of the bit lines BL0 through BL3 in the first column block 416A are also applied to those of the bit lines BL4 through BL7 in the second column block 416B. These settings are described below in detail.

An override voltage (for example, 2.5 V) is applied via the sub-control gate line SCG4 to the control gate 106A of the opposite memory element 192B, which is arranged to face the selected memory element 0C of the twin memory cell 100[5] on the fifth column.

The writing voltage Vwrite (for example, 5.5 V) is applied as the programming control gate voltage via the sub-control gate line SCG5 to the control gate 106B of the selected memory element 0C.

The potentials of the other sub-control gate lines SCG6 and SCG7 are set equal to 0 V.

The programming bit line voltage of, for example, 5 V is set to the potential of the bit line BL5, which is connected with the selected memory element 0C via the sub-bit line SBL5. The power supply voltage Vdd (for example, 1.8 V) is set to the potential of the bit line BL6. The other bit lines BL4 and BL7 are connected to a current generator (not shown).

Under such settings, an electric current Ids of approximately 5 $\mu$A flows through the selected memory element 0C from the bit line BL5 to the bit line BL4, while channel hot electron (CHE) is trapped by the ONO film 109 of the selected MONOS memory element 0C. The data programming operation of the selected MONOS memory element 0C is implemented in this manner, and data '0' is written into the selected memory element 0C.

This arrangement enables data to be written simultaneously into the left-side MONOS memory element 0A of the twin memory cell 100[1] on the first column included in the first column block 416A and into the left-side MONOS memory element 0C of the twin memory cell 100[5] on the fifth column included in the second column block 416B in one main block 416.

The data writing or programming operation into the residual two MONOS memory elements 0B and 0D is carried out as shown in FIG. 19, in the same manner as the data programming operation into the two MONOS memory elements 0A and 0C shown in FIG. 18. In the state of FIG. 19, in the first column block 416A, the power supply voltage Vdd is set to the bit line BL0 of the $0^{th}$ column, while the bit line BL2 of the $2^{nd}$ column is connected to a current generator (not shown). In the second column block 416B, the power supply voltage Vdd is set to the bit line BL4 of the $4^{th}$ column, while the bit line BL6 of the $6^{th}$ column is connected to the current generator.

The above description regards the procedure of first writing data into the left-side MONOS memory element 0A of the twin memory cell 100[1] on the first column in the first column block 416A and into the left-side MONOS memory element 0C of the twin memory cell 100[5] on the fifth column in the second column block 416B as shown in FIG. 18, and subsequently writing data into the right-side MONOS memory element 0B of the twin memory cell 100[1] on the first column in the first column block 416A and into the right-side MONOS memory element 0D of the twin memory cell 100[5] on the fifth column in the second column block 416B as shown in FIG. 19. This procedure is also applied to the case of writing data into twin memory cells on other columns by the 'page buffer writing' function.

The above description regards the memory block 416[0] corresponding to I/O0. The identical operation is performed simultaneously with regard to the other memory blocks 416[1] through 416[15] corresponding to I/O1 through I/O15.

As described above, in the non-volatile semiconductor memory device 10 of this embodiment, data can be written collectively into 2-word MONOS memory elements in the data programming process with the page buffer. The non-volatile semiconductor memory device 10 of the embodiment accordingly enables 4-word data to be written in twice at a high speed, after specification of one row address. This arrangement allows for collective programming of 4-word data registered in the page buffer through the two consecutive series of writing operation. Compared with the prior art structure of sequentially programming 4-word data by the unit of one word, this arrangement ensures the higher-speed programming.

F. Modifications

The embodiment discussed above is to be considered in all aspects as illustrative and not restrictive. There may be many modifications, changes, and alterations without departing from the scope or spirit of the main characteristics of the present invention.

For example, the non-volatile memory elements 108A and 108B are not restricted to the MONOS structure. The technique of the present invention is also applicable to non-volatile semiconductor memory devices including a diversity of other twin memory cells, as long as the twin memory cell is constructed to trap electric charges independently at two different positions by means of one word gate and two control gates.

The number of the banks and the divisional numbers of the memory arrays, the main blocks, the sub-blocks, and the small blocks in the above embodiment are only illustrative, and they may be changed arbitrarily according to the requirements.

In the structure of the above embodiment, one memory block has two column blocks, each including four columns of twin memory cells arrayed in the row direction. Each column block is the unit of the reading operation or the writing operation, so that 4-word data can be read out in the page mode or can be written into the page buffer. This is, however, only illustrative and not restrictive in any sense. For example, each memory block may have only one column block. This arrangement enables 2-word data to be read out in the page mode. In another example, each memory block may have three or more column blocks. The 3-column block structure allows 6-word data to be read out in the page mode or to be written into the page buffer. The 4-column block structure allows 8-word data to be read out in the page mode or to be written into the page buffer. Namely division of each memory block into n column blocks (where n is an integer of not less than 2) enables (2·n)-word data to be read out in the page mode or to be written into the page buffer.

In the structure of the above embodiment, each small block consists of 16 memory blocks, so that data can be input and output by the unit of 1 word (16 bits). This is, however, only illustrative and not restrictive in any sense. Each small block may be divided into any suitable number of memory blocks. For example, the 8-memory block structure allows data to be input and output by the unit of 1 byte (8 bits). The 32-memory block structure allows data to be input and output by the unit of 2 words (32 bits).

The scope and spirit of the present invention are indicated by the appended claims, rather than by the foregoing description.

What is claimed is:

1. A non-volatile semiconductor memory device, comprising:

a memory cell array having multiple twin memory cells arrayed at least in a row direction, where each of the twin memory cells has one word gate, a first non-volatile memory element controlled by a first control gate, and a second non-volatile memory element controlled by a second control gate;

a word line shared by the word gates of the multiple twin memory cells arrayed in the row direction;

multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction;

multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction;

an access control circuit that regulates operations of the word line, the multiple bit lines, and the multiple control gate lines to control a reading operation of information; and a detection circuit that detects the information read via the multiple bit lines, in the non-volatile semiconductor memory device, in the case of reading information from the second non-volatile memory element of an (i)-th twin memory cell and from the first non-volatile memory element of an (i+1)-th twin memory cell in the row direction, where i is an integer of not less than 1, the access control circuit setting a reading word line-selecting voltage to the word line connecting with the word gate of the (i)-th twin memory cell and with the word gate of the (i+1)-th twin memory cell, setting a reading control gate voltage to the second control gate of the second non-volatile memory element of the (i)-th twin memory cell via an (i)-th control gate line connecting with the second control gate, and setting an override voltage to the first control gate of the first non-volatile memory element of the (i)-th twin memory cell via an (i−1)-th control gate line connecting with the first control gate, while setting an override voltage to the second control gate of the second non-volatile memory element of the (i+1)-th twin memory cell via an (i+1)-th control gate line connecting with the second control gate, the detection circuit sensing an (i−1)-th bit line connecting with the first non-volatile memory element of the (i)-th twin memory cell, so as to detect an electric current running between the (i−1)-th bit line and an (i)-th bit line connecting with the second non-volatile memory element of the (i)-th twin memory cell, via the second non-volatile memory element of the (i)-th twin memory cell, sensing an (i+1)-th bit line connecting with the second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell, thereby reading a piece of information stored in the second non-volatile memory element of the (i)-th twin memory cell together with a piece of information stored in the first non-volatile memory element of the (i+1)-th twin memory cell.

2. A non-volatile semiconductor memory device in accordance with claim 1, the non-volatile semiconductor memory device further comprising:

a selection circuit that successively selects the two pieces of information read together by the detection circuit.

3. A non-volatile semiconductor memory device, comprising:

a memory cell array having multiple twin memory cells arrayed at least in a row direction, where each of the twin memory cells has one word gate, a first non-volatile memory element controlled by a first control gate, and a second non-volatile memory element controlled by a second control gate;

a word line shared by the word gates of the multiple twin memory cells arrayed in the row direction;

multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction;

multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction;

an access control circuit that regulates operations of the word line, the multiple bit lines, and the multiple control gate lines to control a reading operation of information; and a detection circuit that detects the information read via the multiple bit lines, the memory cell array being divided into m memory blocks in the row direction, where m is an integer of not less than 1, each of the memory blocks being divided into n column blocks in the row direction, where n is an integer of not less than 2, in the non-volatile semiconductor memory device, in the case of reading information from the second non-volatile memory element of an (i)-th twin memory cell and from the first non-volatile memory element of an (i+1)-th twin memory cell in the row direction in each of the column blocks, where i is an integer of not less than 1, the access control circuit setting a reading word line-selecting voltage to the word line connecting with the word gate of the (i)-th twin memory cell and with the word gate of the (i+1)-th twin memory cell, setting a reading control gate voltage to the second control gate of the second non-volatile memory element of the (i)-th twin memory cell via an (i)-th control gate line connecting with the second control gate, and setting an override voltage to the first control gate of the first non-volatile memory element of the (i)-th twin memory cell via an (i−1)-th control gate line connecting with the first control gate, while setting an override voltage to the second control gate of the second non-volatile memory element of the (i+1)-th twin memory cell via an (i+1)-th control gate line connecting with the second control gate, the detection circuit sensing an (i−1)-th bit line connecting with the first non-volatile memory element of the (i)-th twin memory cell, so as to detect an electric current running between the (i−1)-th bit line and an (i)-th bit line connecting with the second non-volatile memory element of the (i)-th twin memory cell, via the second non-volatile memory element of the (i)-th twin memory cell, sensing an (i+1)-th bit line connecting with the second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell, thereby reading a piece of information stored in the second non-volatile memory element of the (i)-th twin memory cell together with a piece of information stored in the first non-volatile memory element of the (i+1)-th twin memory cell.

4. A non-volatile semiconductor memory device in accordance with claim 3, the non-volatile semiconductor memory device further comprising:

a selection circuit that is provided in each of the memory blocks and successively selects (2·n) pieces of information read together by the detection circuit.

5. A non-volatile semiconductor memory device in accordance with claim 3, wherein the column block includes four twin memory cells arrayed in the row direction, and the memory block includes (4·n) twin memory cells arrayed in the row direction.

6. A method of actuating a non-volatile semiconductor memory device, the non-volatile semiconductor memory device comprising: a memory cell array having multiple twin memory cells arrayed at least in a row direction, where each of the twin memory cells has one word gate, a first non-volatile memory element controlled by a first control gate, and a second non-volatile memory element controlled by a second control gate; a word line shared by the word gates of the multiple twin memory cells arrayed in the row direction; multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction; and multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction, in the case of reading information from the second non-volatile memory element of an (i)-th twin memory cell and from the first non-volatile memory element of an (i+1)-th twin memory cell in the row direction, where i is an integer of not less than 1, the method comprising the steps of:

setting a reading word line-selecting voltage to the word line connecting with the word gate of the (i)-th twin memory cell and with the word gate of the (i+1)-th twin memory cell;

setting a reading control gate voltage to the second control gate of the second non-volatile memory element of the (i)-th twin memory cell via an (i)-th control gate line connecting with the second control gate;

setting an override voltage to the first control gate of the first non-volatile memory element of the (i)-th twin memory cell via an (i−1)-th control gate line connecting with the first control gate, while setting an override voltage to the second control gate of the second non-volatile memory element of the (i+1)-th twin memory cell via an (i+1)-th control gate line connecting with the second control gate; and sensing an (i−1)-th bit line connecting with the first non-volatile memory element of the (i)-th twin memory cell, so as to detect an electric current running between the (i−1)-th bit line and an (i)-th bit line connecting with the second non-volatile memory element of the (i)-th twin memory cell, via the second non-volatile memory element of the (i)-th twin memory cell, sensing an (i+1)-th bit line connecting with the second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell, thereby reading a piece of information stored in the second non-volatile memory element of the (i)-th twin memory cell together with a piece of information stored in the first non-volatile memory element of the (i+1)-th twin memory cell.

7. A method of actuating a non-volatile semiconductor memory device, the non-volatile semiconductor memory device comprising: a memory cell array having multiple twin memory cells arrayed at least in a row direction, where each of the twin memory cells has one word gate, a first non-volatile memory element controlled by a first control gate, and a second non-volatile memory element controlled by a second control gate; a word line shared by the word gates of the multiple twin memory cells arrayed in the row direction; multiple bit lines, each of which is provided for every pair of adjoining twin memory cells in the row direction and is shared by the first non-volatile memory element included in one twin memory cell of the twin memory cell pair and by the second non-volatile memory element included in the other twin memory cell to be extended in a column direction; and multiple control gate lines, each of which is provided for every pair of adjoining twin memory cells in the row direction and is shared by the first control gate of the first non-volatile memory element included in one twin memory cell of the twin memory cell pair and by the second control gate of the second non-volatile memory element included in the other twin memory cell to be extended in the column direction, the memory cell array being divided into m memory blocks in the row direction, where m is an integer of not less than 1, each of the memory blocks being divided into n column blocks in the row direction, where n is an integer of not less than 2, in the case of reading information from the second non-volatile memory element of an (i)-th twin memory cell and from the first non-volatile memory element of an (i+1)-th twin memory cell in the row direction in each of the column blocks, where i is an integer of not less than 1, the method comprising the steps of:

setting a reading word line-selecting voltage to the word line connecting with the word gate of the (i)-th twin memory cell and with the word gate of the (i+1)-th twin memory cell;

setting a reading control gate voltage to the second control gate of the second non-volatile memory element of the (i)-th twin memory cell via an (i)-th control gate line connecting with the second control gate;

setting an override voltage to the first control gate of the first non-volatile memory element of the (i)-th twin memory cell via an (i−1)-th control gate line connecting with the first control gate, while setting an override voltage to the second control gate of the second non-volatile memory element of the (i+1)-th twin memory cell via an (i+1)-th control gate line connecting with the second control gate; and sensing an (i−1)-th bit line connecting with the first non-volatile memory element of the (i)-th twin memory cell, so as to detect an electric current running between the (i−1)-th bit line and an (i)-th bit line connecting with the second non-volatile memory element of the (i)-th twin memory cell, via the second non-volatile memory element of the (i)-th twin memory cell, sensing an (i+1)-th bit line connecting with the second non-volatile memory element of the (i+1)-th twin memory cell, so as to detect an electric current running between the (i+1)-th bit line and the (i)-th bit line connecting with the first non-volatile memory element of the (i+1)-th twin memory cell, via the first non-volatile memory element of the (i+1)-th twin memory cell, thereby reading a piece of information stored in the second non-volatile memory element of the (i)-th twin memory cell together with a piece of information stored in the first non-volatile memory element of the (i+1)-th twin memory cell.

* * * * *